(12) United States Patent
Yoon et al.

(10) Patent No.: US 9,502,137 B2
(45) Date of Patent: Nov. 22, 2016

(54) METHOD AND DEVICE FOR OPTIMIZING LOG LIKELIHOOD RATIO (LLR) USED FOR NONVOLATILE MEMORY DEVICE AND FOR CORRECTING ERRORS IN NONVOLATILE MEMORY DEVICE

(71) Applicant: SAMSUNG ELECTRONICS CO., LTD., Suwon-Si, Gyeonggi-Do (KR)

(72) Inventors: Sang-Yong Yoon, Seoul (KR); Kyung-Ryun Kim, Yuseong-gu (KR); Jin-Young Chun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 192 days.

(21) Appl. No.: 14/205,482

(22) Filed: Mar. 12, 2014

(65) Prior Publication Data

US 2014/0281771 A1 Sep. 18, 2014

(30) Foreign Application Priority Data

Mar. 15, 2013 (KR) ........................ 10-2013-0028266

(51) Int. Cl.
| | | |
|---|---|---|
| G11C 29/00 | (2006.01) |
| G11C 29/50 | (2006.01) |
| G06F 11/10 | (2006.01) |
| G11C 29/02 | (2006.01) |
| H03M 13/39 | (2006.01) |
| G11C 16/34 | (2006.01) |
| G11C 11/56 | (2006.01) |

(52) U.S. Cl.
CPC ..... *G11C 29/50004* (2013.01); *G06F 11/1048* (2013.01); *G06F 11/1068* (2013.01); *G11C 29/026* (2013.01); *G11C 29/028* (2013.01); *G11C 11/56* (2013.01); *G11C 16/34* (2013.01); *H03M 13/3927* (2013.01)

(58) Field of Classification Search
CPC ............ G11C 29/50004; G11C 29/026; G11C 29/028; G11C 11/56; G11C 16/34; G11C 11/1068; G11C 11/1048; H03M 13/3927
USPC ................................ 714/721, 752, 763, 780
See application file for complete search history.

(56) References Cited

U.S. PATENT DOCUMENTS

| | | | |
|---|---|---|---|
| 7,656,707 B2 | 2/2010 | Kozlov | |
| 8,078,940 B2 | 12/2011 | Uchikawa et al. | |
| 8,149,623 B2 | 4/2012 | Uchikawa et al. | |
| 8,156,403 B2 | 4/2012 | Shalvi et al. | |
| 2008/0320346 A1* | 12/2008 | Lin | G06F 11/1072 714/721 |
| 2009/0207659 A1* | 8/2009 | Song | G11C 11/5642 365/185.03 |

(Continued)

FOREIGN PATENT DOCUMENTS

JP 2009-271852 A 11/2009

*Primary Examiner* — Albert Decady
*Assistant Examiner* — Osman M Alshack
(74) *Attorney, Agent, or Firm* — Volentine & Whitt, PLLC

(57) ABSTRACT

In a method of optimizing a log likelihood ratio (LLR) used to correct errors related to data stored in a nonvolatile memory device, variation of threshold voltage distribution for a plurality of memory cells included in the nonvolatile memory device is monitored, and the LLR for the memory cells is updated based on a monitoring result. Although the characteristics of the memory cells are deteriorated, the LLR is continuously maintained to the optimal value.

18 Claims, 22 Drawing Sheets

(56) References Cited

U.S. PATENT DOCUMENTS

| | | | |
|---|---|---|---|
| 2009/0234792 A1* | 9/2009 | Kim | G06N 99/005 706/50 |
| 2010/0027342 A1* | 2/2010 | Eun | G11C 11/5642 365/185.18 |
| 2010/0223538 A1 | 9/2010 | Sakurada | |
| 2011/0038212 A1* | 2/2011 | Uchikawa | G11C 11/5642 365/185.18 |
| 2011/0145681 A1 | 6/2011 | Yang | |
| 2011/0209031 A1 | 8/2011 | Kim et al. | |
| 2011/0216598 A1 | 9/2011 | Kim et al. | |
| 2011/0235415 A1* | 9/2011 | Park | G11C 11/5642 365/185.09 |
| 2011/0305082 A1 | 12/2011 | Haratsch et al. | |
| 2012/0072805 A1* | 3/2012 | Tseng | G06F 11/1048 714/773 |
| 2012/0213001 A1* | 8/2012 | Yang | G06F 11/1048 365/185.2 |
| 2012/0224420 A1* | 9/2012 | Sakurada | G11C 8/08 365/185.03 |
| 2012/0262991 A1* | 10/2012 | Ghilardelli | G11C 16/3418 365/185.18 |
| 2013/0163330 A1* | 6/2013 | Sharon | G11C 11/5642 365/185.09 |
| 2014/0016410 A1* | 1/2014 | Choi | G11C 16/26 365/185.03 |
| 2014/0153338 A1* | 6/2014 | Byeon | G11C 16/28 365/185.21 |

\* cited by examiner

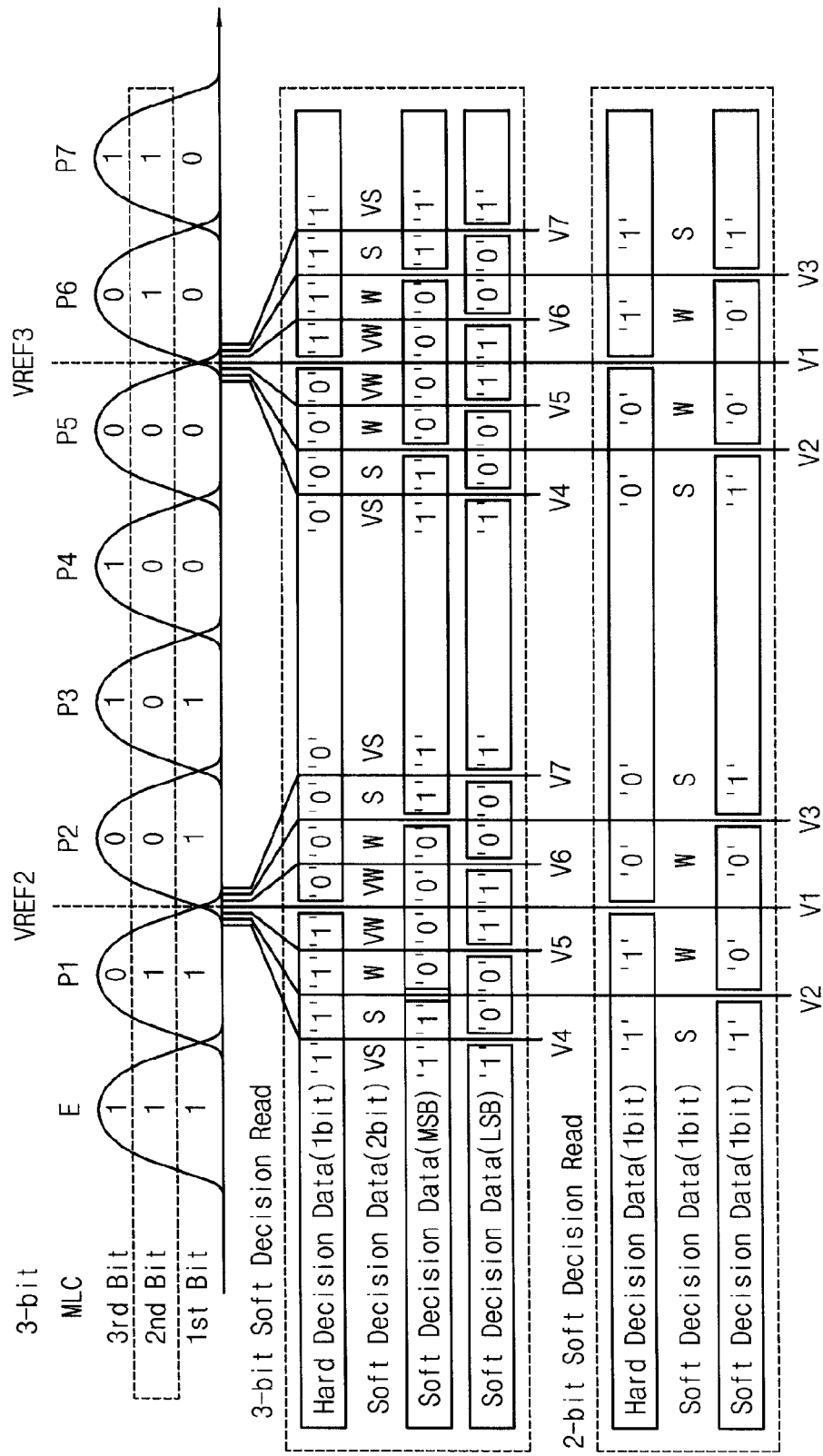

2300

METHOD AND DEVICE FOR OPTIMIZING LOG LIKELIHOOD RATIO (LLR) USED FOR NONVOLATILE MEMORY DEVICE AND FOR CORRECTING ERRORS IN NONVOLATILE MEMORY DEVICE

CROSS-REFERENCE TO RELATED APPLICATION

This application claims priority under 35 USC §119 to Korean Patent Application No. 10-2013-0028266 filed on Mar. 15, 2013 in the Korean Intellectual Property Office (KIM), the entire disclosure of which is incorporated herein by reference.

BACKGROUND

1. Technical Field

Example embodiments relate generally to a nonvolatile memory device, and more particularly to a method of optimizing a log likelihood ratio (LLR) used in a nonvolatile memory device, and a method of correcting errors in a nonvolatile memory device using the same.

2. Description of the Related Art

Semiconductor memory devices may be classified into volatile memory devices and nonvolatile memory devices depending on whether or not stored data are lost when power supply is shut off. The operating modes of the nonvolatile memory device are classified into a write mode (or program mode) to store data in a memory cell, a read mode to read out data stored in the memory cell, and an erase mode to delete the stored data to initialize the memory cell. In general, in the nonvolatile memory device, an error correction encoding scheme is performed with respect to programmed data, and an error correction decoding scheme is performed with respect to read-out data.

SUMMARY

Some example embodiments provide a method of optimizing a Log Likelihood Ratio (LLR) algorithm used when correcting errors related to data stored in a nonvolatile memory device.

Some example embodiments provide a method of correcting errors by the nonvolatile memory device employing the optimized LLR.

In a method of optimizing a log likelihood ratio (LLR) used to correct errors related to data stored in a nonvolatile memory device, a variation of a threshold voltage distribution for a plurality of memory cells included in the nonvolatile memory device is monitored, and the LLR for the memory cells is updated based on a result of the monitoring.

In example embodiments, the monitoring of the variation of the threshold voltage distribution may include detecting a present threshold voltage distribution for the memory cells and estimating a variation direction and a variation degree of the threshold voltage distribution by comparing a previously-stored initial threshold voltage distribution for the memory cells with the present threshold voltage distribution.

The initial threshold voltage distribution may correspond to a number of first memory cells, among the memory cells of the nonvolatile memory device, having a threshold voltage which is less than a first voltage in an initial stage of an operation of the nonvolatile memory device, and a number of second memory cells, among the memory cells of the nonvolatile memory device, having a threshold voltage which is greater than a second voltage in the initial stage of the operation of the nonvolatile memory device. The present threshold voltage distribution may correspond to a number of third memory cells, among the memory cells of the nonvolatile memory device, having a threshold voltage which is less than the first voltage in a present state, and a number of fourth memory cells, among the memory cells of the nonvolatile memory device, having a threshold voltage which is greater than the second voltage in the present state.

Each of the memory cells may be a single level memory cell (SLC) to store one data bit therein. The first voltage may be a voltage corresponding to an erased state, and the second voltage may be a voltage corresponding to a programmed state.

Each of the memory cells may be a multi-level memory cell (MLC) to store a plurality of data bits therein. The first voltage may be a voltage corresponding to an erased state, and the second voltage may be a voltage corresponding to a programmed state having a highest level.

The MLC may be a 2-bit memory cell to store 2-bit data, or a 3-bit memory cell to store 3-bit data.

The monitoring of the variation of the threshold voltage distribution may include estimating a variation direction and a variation degree of the threshold voltage distribution based on a difference between a number of first memory cells, among the memory cells of the nonvolatile memory device, having a threshold voltage between a first voltage and a second voltage in a present state, and a number of second memory cells, among the memory cells of the nonvolatile memory device, having a threshold voltage between the first voltage and a third voltage in the present state.

The first voltage may be a voltage corresponding to a hard decision read-out operation, and the second and third voltages may be voltages corresponding to a soft decision read-out operation.

In example embodiments, the threshold voltage distribution may be varied due to at least one of a disturbance between adjacent memory cells and an elapse of a data retention time.

The threshold voltage distribution may be moved in a first direction due to the disturbance between the adjacent memory cells, and moved in a second direction different from the first direction due to the elapse of the data retention time.

In a method of correcting errors related to data when reading out the data stored in a nonvolatile memory device, an LLR for a plurality of memory cells included in the nonvolatile memory device is optimized, and error correction for the stored data is performed based on the optimized LLR. The optimizing of the LLR includes monitoring a variation of a threshold voltage distribution for the memory cells, and updating the LLR for the memory cells based on a result of the monitoring.

In example embodiments, the performing of the error correction for the stored data may include performing error correction for the stored data by using a low density parity check (LDPC) code.

In example embodiments, the optimizing of the LLR and the performing of the error correction may be performed with a memory controller provided outside the nonvolatile memory device.

In example embodiments, the nonvolatile memory device may be a vertical-type memory device in which a plurality of word lines are vertically stacked.

In example embodiments, the nonvolatile memory device may include a memory cell array including the memory cells connected to a plurality of word lines and a plurality of bit lines, a row decoder connected to the word lines, and a page buffer connected to the bit lines.

An article of manufacture comprises: a log likelihood ratio (LLR) optimizer configured to optimize a log-likelihood ratio for a plurality of memory cells included in a nonvolatile memory device; and an error correction code (ECC) decoder configured to perform error correction for the stored data based on the optimized LLR. The log likelihood ratio optimizer is configured to monitor a variation of a threshold voltage distribution for the memory cells, and to update the LLR for the memory cells based on a result of the monitoring.

In example embodiments, the article of manufacture comprises a memory controller including the log likelihood ratio optimizer and the ECC decoder.

In example embodiments, the article of manufacture further comprises the nonvolatile memory device.

In example embodiments, the log likelihood ratio optimizer is configured to monitor the variation of the threshold voltage distribution by: detecting a present threshold voltage distribution for the memory cells; and estimating a variation direction and a variation degree of the threshold voltage distribution by comparing a previously-stored initial threshold voltage distribution for the memory cells with the present threshold voltage distribution.

In example embodiments, the log likelihood ratio optimizer is configured to monitor the variation of the threshold voltage distribution by: estimating a variation direction and a variation degree of the threshold voltage distribution based on a difference between a number of first memory cells, among the plural memory cells of the nonvolatile memory device, having a threshold voltage between a first voltage and a second voltage in a present state of the nonvolatile memory device, and a number of second memory cells, among the memory cells of the nonvolatile memory device, having a threshold voltage between the first voltage and a third voltage in the present state

BRIEF DESCRIPTION OF THE DRAWINGS

Illustrative, non-limiting example embodiments will be more clearly understood from the following detailed description taken in conjunction with the accompanying drawings.

FIGS. 13A to 13C are views to explain one example of a soft decision read-out operation performed in a nonvolatile memory device including a 3-bit multi-level cell.

DETAILED DESCRIPTION OF THE EMBODIMENTS

Figure 1:
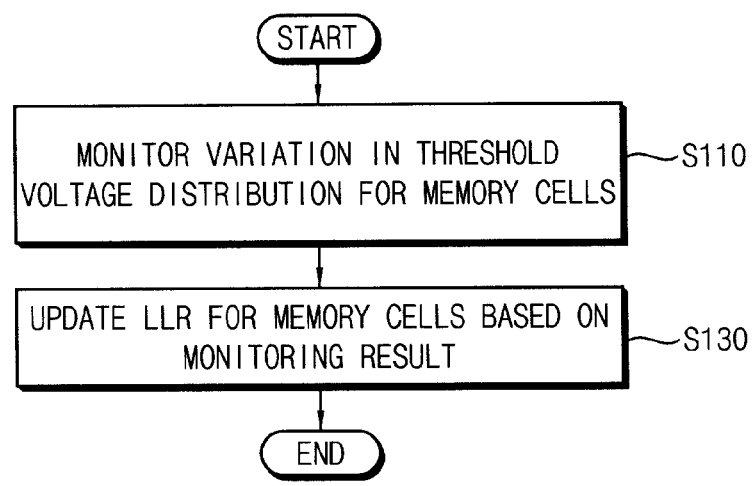
FIG. 1 is a flowchart illustrating a method of optimizing an LLR (Log Likelihood Ratio) used in a nonvolatile memory device according to example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises,"

"comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of optimizing an LLR (Log Likelihood Ratio) used in a nonvolatile memory device according to example embodiments. FIGS. 2A, 2B, 3A and 3B are views to explain the method of optimizing the LLR used in the nonvolatile memory device of FIG. 1.

The method of optimizing the LLR used in the nonvolatile memory device illustrated in FIG. 1 may be applied to the nonvolatile memory device to perform error correction with respect to data stored in the process of reading out data. The read-out operation performed by the nonvolatile memory device may include a hard decision read-out operation and/or a soft decision read-out operation. The LLR is used to correct errors related to the data stored in the nonvolatile memory device. In particular, the LLR may be used when correcting errors by using a Low Density Parity Check (LDPC) code. Hereinafter, the example embodiments will be described while focusing on a flash memory device. The method of optimizing the LLR used in the nonvolatile memory device according to the example embodiments may be used in predetermined nonvolatile memory devices such as a Phase Change Random Access Memory (PRAM), a Resistance Random Access Memory (RRAM), a Magnetic Random Access Memory (MRAM), or a Ferroelectric random access memory (FRAM).

Referring to FIGS. 1, 2A, 2B, 3A, and 3B, in the method of optimizing the LLR used in the nonvolatile memory device according to the example embodiments, the variation in the threshold voltage distribution for a plurality of memory cells included in the nonvolatile memory device is monitored (step S110). The LLR is updated with respect to the memory cells based on the monitoring result (step S130).

The LLR is a value obtained by applying a logarithm (log) to the ratio of probability in which data stored in the memory cells correspond to "1" or "0." Initial threshold voltage distribution is estimated with respect to the memory cells at a point at which the nonvolatile memory device is designed/manufactured, and the initial value of the LLR may be determined based on initial threshold voltage distribution. However, the initial threshold voltage distribution may be deformed/distorted due to the deterioration in the characteristics of the memory cells. If the LLR having the initial value is used when the initial threshold voltage distribution is deformed/distorted as described above, the error correction may not be performed with exactness or precision.

Figure 2A:
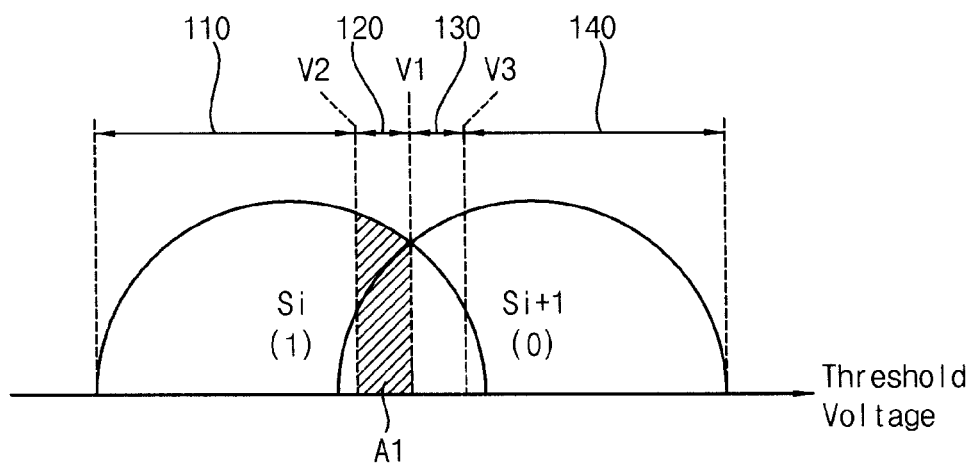
FIGS. 2A, 2B, 3A and 3B are views to explain the method of optimizing the LLR used in the nonvolatile memory device of FIG. 1.
Figure 2B:
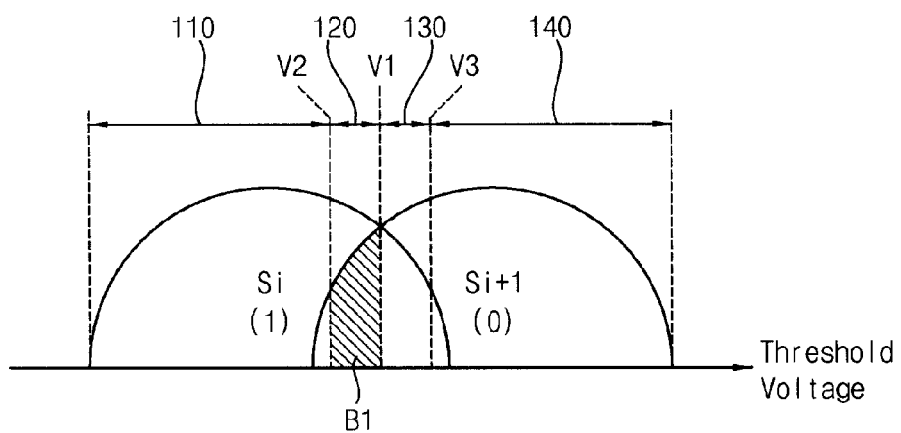

For example, the nonvolatile memory device may have the initial threshold voltage distribution as illustrated in FIGS. 2A and 2B. The initial threshold voltage distribution may include a first state Si corresponding to data having a logic value of "1" and a second state Si+1 corresponding to data having a logic value of "0". When the nonvolatile memory device performs the hard decision read-out operation and the 2-bit soft decision read-out operation, the initial threshold voltage distribution may be divided into four sections 110, 120, 130, and 140 based on three voltages V1, V2, and V3. The hard decision read-out operation and the 2-bit soft decision read-out operation will be described later with reference to FIG. 11.

Since LLRs may not be optimized with respect to all memory cells, the initial values of the LLRs may be determined in such a manner that the initial threshold voltage distribution is divided into four sections 110, 120, 130, and 140, and memory cells belonging to one section are determined to have the same value. For one example, the initial value of the LLR for section 120 may be acquired based on following Equation 1.

$$LLR1 = \log\left(\frac{B1}{A1}\right) \qquad \text{Equation 1}$$

In Equation 1, A1 may correspond to an area A1 of FIG. 2A, and B1 may correspond to an area B1 of FIG. 2B. A1 may represent a probability with which data stored in memory cells corresponds to a logic value of "1", and may represent the number of memory cells having data stored therein corresponding to the logic value of "1" among memory cells having a threshold voltage between the first and second voltages V1 and V2 in the initial threshold voltage distribution. B1 may represent a probability with which data stored in memory cells corresponds to a logic value of "0" and may represent the number of memory cells having data stored therein corresponding to the logic value of "0" among the memory cells having the threshold voltage between the first and second voltages V1 and V2 in the initial threshold voltage distribution.

Similarly, the initial values of LLRs may be acquired with respect to remaining sections 110, 130, and 140. Accordingly, one of the four initial values of the LLRs may be allocated to each of the memory cells included in the nonvolatile memory device. When the nonvolatile memory device corrects errors by using an LDPC code in the process of reading out data, the initial values of the LLRs may be used.

Figure 3A:
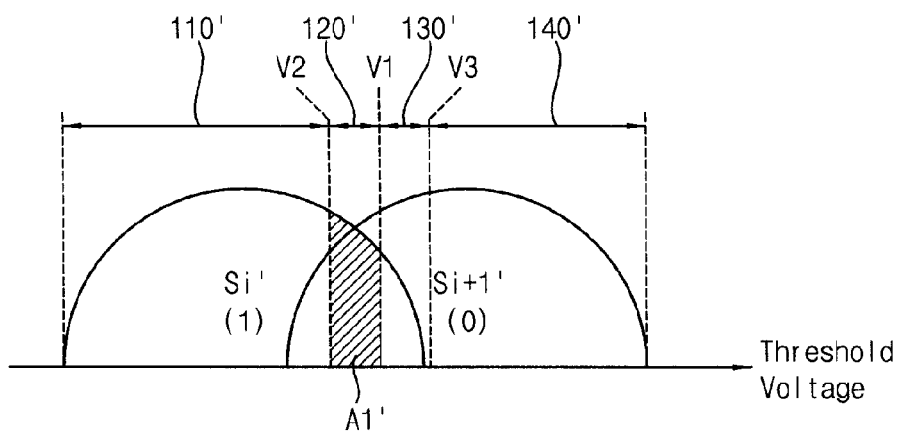
Figure 3B:
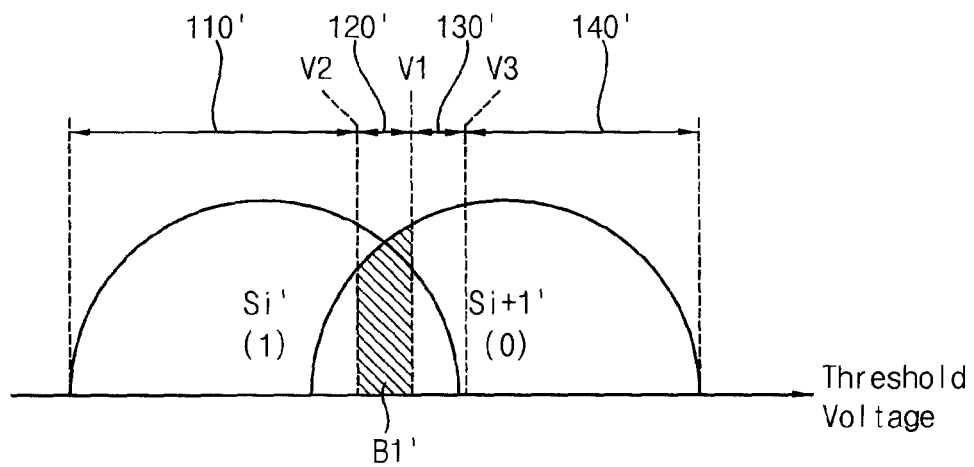

When the characteristics of the memory cells are deteriorated, the nonvolatile memory device may have present threshold voltage distribution illustrated in FIGS. 3A and 3B. The present threshold voltage distribution may include a first state Si' corresponding to data having a logic value of "1" and a second state Si+1' corresponding to data having a logic value of "0". When comparing with the initial threshold voltage distribution illustrated in FIGS. 2A and 2B, the present threshold voltage distribution may be moved in a direction of decreasing the magnitude of the threshold voltage (to the left), and the position of a valley at which two state graphs cross each other may be changed. However, since voltages V1, V2, and V3 are fixed, sections 110', 120', 130', and 140' divided by the voltages V1, V2, and V3 and the number of memory cells corresponding to each of sections 110', 120', 130', and 140' may be varied. In this case, the error correction performance may be degraded when the initial values of the LLRs described with reference to FIGS. 2A and 2B are used.

In the method of optimizing the LLR used in the nonvolatile memory device according to the example embodiments, the variation of the threshold voltage distribution resulting from the deterioration in the characteristics of the memory cells is monitored, and the LLR is updated based on the monitoring result. According to one example embodiment, the updated value (i.e., the optimal value) of the LLR for the section 120' can be acquired based on Equation 2.

$$LLR1' = \log\left(\frac{B1'}{A1'}\right) \quad \text{Equation 2}$$

In Equation 2, A1' may correspond to an area A1' of FIG. 3A, and represent the number of memory cells having data stored therein corresponding to the logic value of "1" among memory cells having a threshold voltage between the first and second voltages V1 and V2 in the present threshold voltage distribution. In addition, B1' may correspond to an area B1' of FIG. 3B, and represent the number of memory cells having data stored therein corresponding to the logic value of "0" among the memory cells having the threshold voltage between the first and second voltages V1 and V2 in the present threshold voltage distribution.

Similarly, the optimal values of LLRs may be acquired with respect to remaining sections 110', 130', and 140'. Accordingly, one of the four optimal values of the LLRs may be allocated to each of the memory cells included in the nonvolatile memory device. When the nonvolatile memory device corrects errors by using an LDPC code in the process of reading out data, the optimal values of the LLRs may be used. When the method of optimizing the LLR used in the nonvolatile memory device according to the example embodiments are used, the error correction performance and data read-out performance of the nonvolatile memory device can be improved.

Meanwhile, although FIGS. 2A, 2B, 3A, and 3B illustrate the example embodiments according to the 2-bit soft decision read-out operation, the LLR update operation (LLR optimizing operation) illustrated in FIGS. 2A, 2B, 3A, and 3B is applicable even if the nonvolatile memory device performs a 3-bit soft decision read-out operation. According to the 3-bit soft decision read-out operation, the threshold voltage distribution may be divided into eight sections based on seven voltages, and the details thereof will be described later with reference to FIG. 12. In addition, although FIGS. 2A, 2B, 3A, and 3B illustrate two adjacent states Si and Si+1, the 2-bit soft decision read-out operation and the 3-bit read-out operation may be performed to distinguish between two adjacent states among a plurality of states, and the details thereof will be described later with reference FIGS. 13A, 13B, and 13C.

Figure 4A:
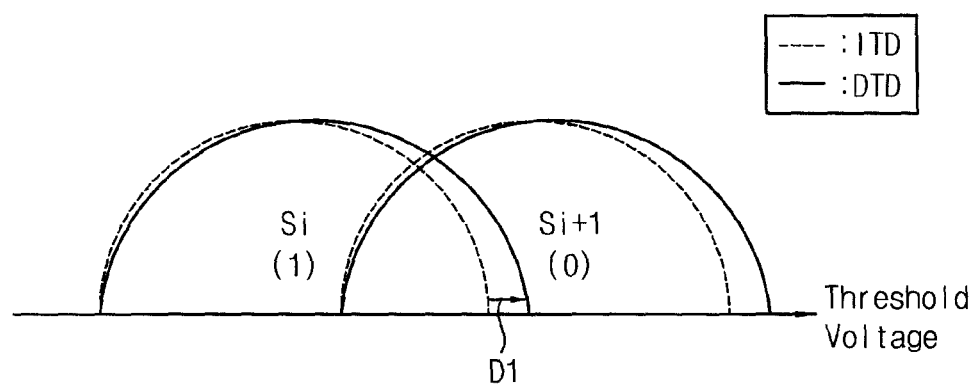
FIGS. 4A and 4B are views to explain a situation wherein that the characteristics of memory cells included in the nonvolatile memory device are deteriorated.
Figure 4B:
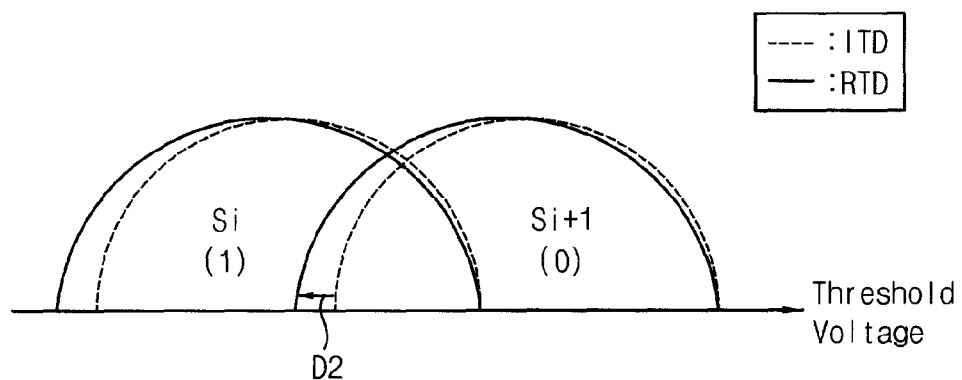

FIGS. 4A and 4B are views to explain a situation wherein the characteristics of memory cells included in the nonvolatile memory device are deteriorated.

Referring to FIGS. 4A and 4B, when the characteristics of the memory cells are deteriorated, the threshold voltage distribution for the memory cells may be varied. For example, the threshold voltage distribution may be varied due to the disturbance between adjacent memory cells and/or the elapse of the data retention time.

According to one example embodiment, as illustrated in FIG. 4A, the threshold voltage distribution may be varied due to the disturbance between the adjacent memory cells, and may be moved in a first direction D1 from the initial threshold voltage distribution ITD to the first threshold voltage distribution DTD. For example, the disturbance may include program disturbance, erase disturbance, and back pattern dependency.

According to another embodiment, as illustrated in FIG. 4B, the threshold voltage distribution may be varied due to the elapse of the data retention time, and may be moved in a second direction D2 from the initial threshold voltage distribution ITD to the second threshold voltage distribution RTD. For example, if the data retention time elapses, charge loss may occur to discharge charges trapped in a floating gate or a tunnel oxide. If a program operation and an erase operation are repeated, the tunnel oxide is deteriorated, so that the charge loss may be more increased.

Although illustrated separately in FIGS. 4A and 4B, according to the example embodiments, the threshold voltage distribution may be varied due to both the disturbance between the adjacent memory cells and the elapse of the data retention time.

Figure 5:
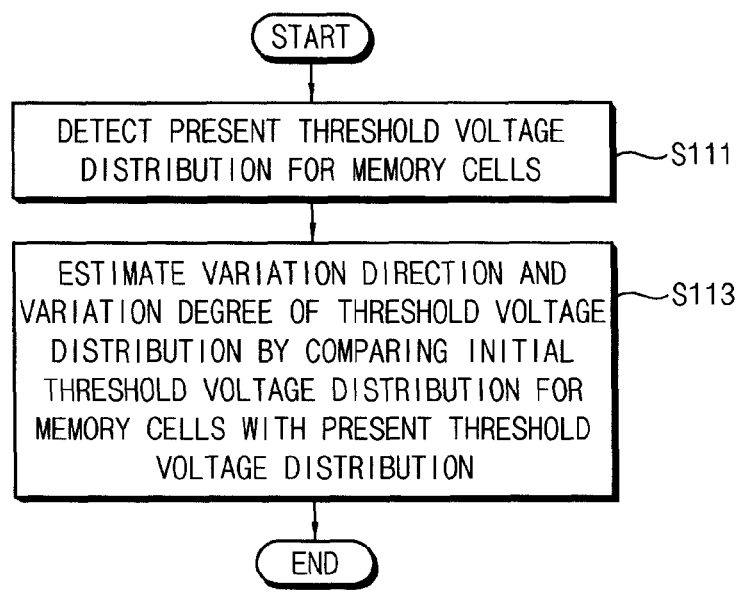
FIG. 5 is a flowchart illustrating one example of a step of monitoring the variation in threshold voltage distribution.
Figure 6:
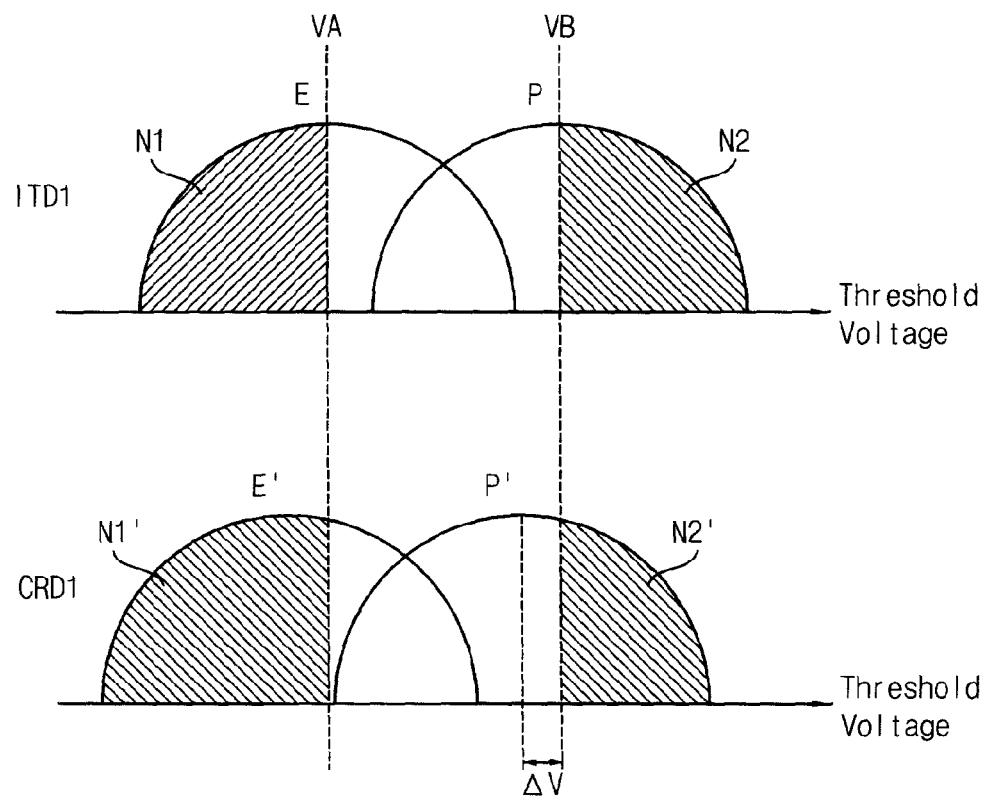
FIGS. 6 and 7 are views to explain the step of monitoring the variation in threshold voltage distribution of FIG. 5.
Figure 7:
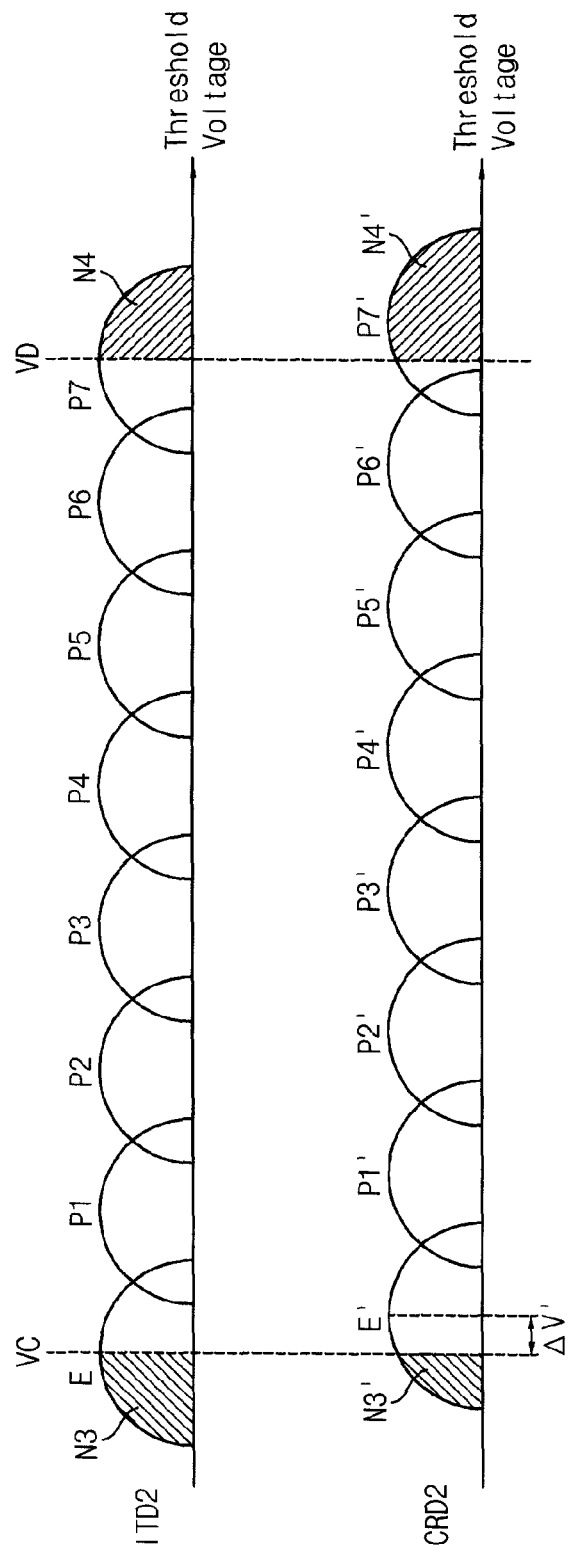

FIG. 5 is a flowchart illustrating one example of a step of monitoring the variation in threshold voltage distribution of FIG. 1. FIGS. 6 and 7 are views to explain the step of monitoring the variation in threshold voltage distribution of FIG. 5.

Referring to FIG. 5, in order to monitor the variation in the threshold voltage distribution, the present threshold voltage distribution for the memory cells can be detected (step S111). The variation direction and the variation degree of the threshold voltage distribution can be estimated by comparing the previously-stored initial threshold voltage distribution for the memory cells with the present threshold voltage distribution (step S113).

According to one example embodiment, the initial threshold voltage distribution may correspond to the number of first memory cells having a threshold voltage which is less than a first voltage at the initial stage of the operation of the nonvolatile memory device among a plurality of memory cells, and the number of second memory cells having a threshold voltage which is greater than a second voltage in the initial stage of the operation of the nonvolatile memory device, among the plurality of memory cells. The present threshold voltage distribution may correspond to the number of third memory cells having a threshold voltage which is less than the first voltage among the memory cells in a present state, and the number of the fourth memory cells having a threshold voltage which is greater than the second voltage among the memory cells in the present state.

For example, as illustrated in FIG. 6, each memory cell may be a single level memory cell to store one data bit. In this case, the initial threshold voltage distribution ITD1 may have a first state E (i.e., erased state) and a second state P (i.e., programmed state). An initial threshold voltage distribution ITD1 may correspond to the number N1 of first memory cells having a threshold voltage which is less than a first voltage VA at the initial stage of the operation of the nonvolatile memory device, and the number N2 of second memory cells having the threshold voltage which is greater than the second voltage VB in the initial stage of the operation of the nonvolatile memory device. A present threshold voltage state CRD1 may have a first state E' and a second state P'. The present threshold voltage state CRD1 may correspond to the number N1' of third memory cells having a threshold voltage which is less than the first present voltage VA and the number N2' of fourth memory cells having a threshold voltage which is greater than the second voltage VB.

According to the example embodiment of FIG. 6, the number N1' of third memory cells is increased compared to the number N1 of first memory cells, and the number N2' of fourth memory cells is decreased compared to the number N2 of second memory cells N2. Accordingly, the variation direction of the threshold voltage distribution may be estimated as the direction of decreasing the magnitude of the threshold voltage (i.e., to the left). The variation degree ΔV of the threshold voltage distribution may correspond to the difference between the number N1' of third memory cells and the number N1 of first memory cells and the difference between the number N2 of the second memory cells and the number N2' of the fourth memory cells.

In addition, according to the example embodiment of FIG. 6, the first voltage VA may be a voltage corresponding to the erased state E, and the second voltage VB may be a voltage corresponding to the programmed state P. The first voltage VA may be an intermediate value or an average value of the threshold voltage at the erased state E in the initial stage of the operation, and the second voltage VB may be an intermediate value or an average value of the threshold voltage at the programmed state P at the initial stage of the operation.

According to another example embodiment, each memory cell may be a multi-level memory cell (MLC) to store a plurality of data bits. In detail, the multi-level memory cell may be, for example, a 2-bit memory cell to store 2-bit data, or a 3-bit memory cell to store 3-bit data. When the memory cells are the multi-level memory cells, the initial threshold voltage distribution ITD2 may have the first state (i.e., erased state) and second to eighth states P1, P2, P3, P4, P5, P6, and P7 (i.e., programmed states) as illustrated in FIG. 7. The initial threshold voltage distribution ITD2 may correspond to the number N3 of first memory cells having a threshold voltage which is less than the first voltage VC in the initial stage of the operation, and the number N4 of the second memory cells having a threshold voltage which is greater than the second voltage VD in the initial stage of the operation. The present threshold voltage state CRD2 may have the first state E' and the second to eighth stages P1', P2', P3', P4', P5', P6', and P7'. The present threshold voltage state CRD2 may correspond to the number N3' of third memory cells having a threshold voltage which is less than the first present voltage VC, and the number N4' of fourth memory cells having a threshold voltage which is greater than the second present voltage VD.

According to the example embodiment of FIG. 7, the number N3' of third memory cells is decreased compared to the number N3 of the first memory cells, and the number N4' of fourth memory cells is increased compared to the number N4 of second memory cells. Accordingly, the variation direction of the threshold voltage distribution may be estimated as the direction of increasing the magnitude of the threshold voltage (i.e., to the right). The variation degree ΔV' of the threshold voltage distribution may correspond to the difference between the number N3 of first memory cells and the number N3' of third memory cells and the difference between the number N4' of fourth memory cells and the number N4 of second memory cells.

In addition, according to the example embodiment of FIG. 7, the first voltage VC may be a voltage corresponding to the erased state E, and the second voltage VD may be a voltage corresponding to the highest-level programmed state (e.g., voltage corresponding to the eighth state P7). In detail, the first voltage VC may be an intermediate value or an average value of the threshold voltage at the erased state E in the initial stage of the operation, and the second voltage VD may be an intermediate value or an average value of the threshold voltage at the highest-level programmed state P7 at the initial stage of the operation.

Meanwhile, although not illustrated in drawings, according to the example embodiments of FIGS. 6 and 7, the first voltages VA and VC and the second voltages VB and VD may have a value corresponding to at least one read-out voltage.

According to other example embodiments, in order to monitor the variation in the threshold voltage distribution for the memory cells illustrated in FIG. 1, the variation direction and the variation degree of the threshold voltage distribution may be estimated based on the difference between the number of first memory cells, which have a threshold voltage between the first voltage and the second voltage in a present state. among the plural memory cells, and the number of second memory cells having a threshold voltage between the first voltage and the third voltage in the present state among the memory cells. In this case, different from the example embodiments described with reference to FIGS. 5, 6, and 7, the variation direction and the variation degree of the threshold voltage distribution may be estimated by using only the present threshold voltage distribution without the initial threshold voltage distribution.

Figure 8:
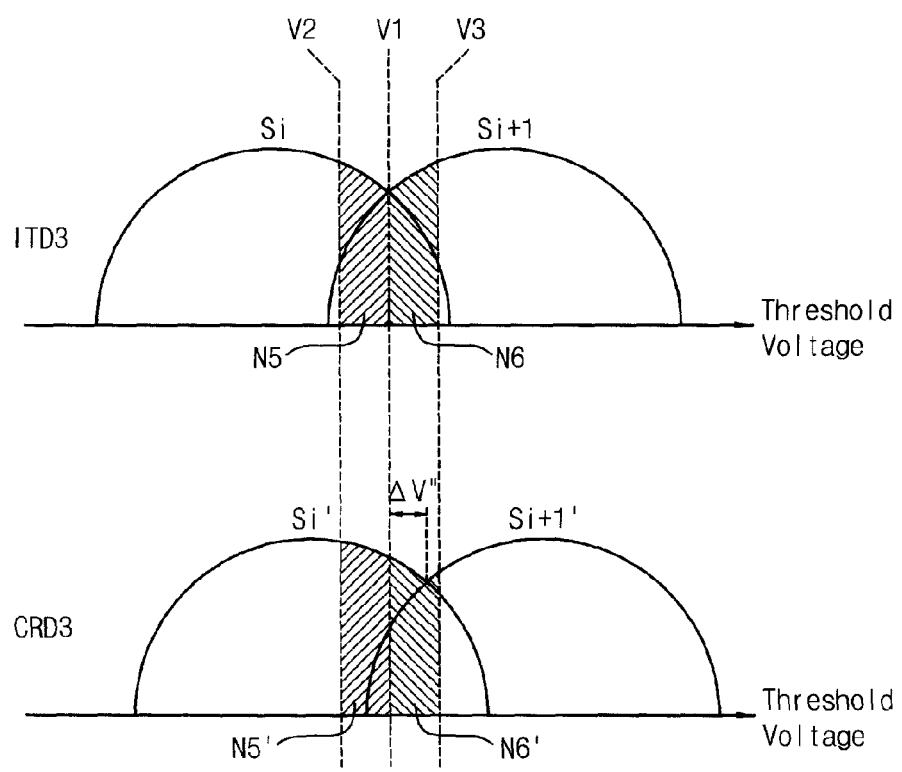
FIG. 8 is a view to explain another example of a step of monitoring the variation in the threshold voltage distribution of FIG. 1.

For example, as illustrated in FIG. 8, the initial threshold voltage distribution ITD3 may have the first state Si and the second state Si+1. FIG. 8 illustrates two adjacent states Si and Si+1 among a plurality of states. The initial threshold voltage distribution ITD3 may correspond to the number N5 of first memory cells having a threshold voltage between the first voltage V1 and the second voltage V2 in the initial stage of the operation, and the number N6 of second memory cells having a threshold voltage between the first voltage V1 and the third voltage V3 in the initial stage of the operation. The present threshold voltage state CRD3 may have the first state Si' and the second state Si+1' adjacent to each other. The present threshold voltage state CRD3 may correspond to the number N5' of third memory cells having a threshold voltage between the first voltage V1 and the second voltage V2 in the present state and the number N6' of fourth memory cells having a threshold voltage between the first voltage V1 and the third voltage V3 in the present state. In this case, the variation direction and the variation degree of the threshold voltage distribution may be estimated based on the difference between the number N5' of third memory cells, which have a threshold voltage between the first voltage V1 and the second voltage V2 in the present state, among the plural memory cells and the number N6' of fourth memory cells having a threshold voltage between the first voltage V1 and the third voltage V3 in the present state, among the memory cells.

According to the example embodiment of FIG. 8, since the number N5' of third memory cells is greater than the number N6' of fourth memory cells, the variation direction of the threshold voltage distribution may be estimated as the direction of increasing the magnitude of the threshold voltage (i.e., to the right). The variation degree ΔV'' of the threshold voltage distribution may be proportional to the difference between the number N5' of third memory cells and the number N6' of fourth memory cells.

In addition, according to the example embodiment of FIG. 8, the first voltage V1 may be a voltage corresponding to a hard decision read-out operation, and the second and third voltages V2 and V3 may be voltages corresponding to a soft decision read-out operation.

As described with reference to FIGS. 1 to 8, in the method of optimizing the LLR used in the nonvolatile memory device according to the example embodiments, the variation of the threshold voltage distribution resulting from the deterioration in the characteristics of the memory cells is monitored, and the LLR is updated to the optimal value based on the monitoring result. Accordingly, even if the characteristics of the memory cells are deteriorated, the LLR may be continuously maintained to the optimal value.

Figure 9:
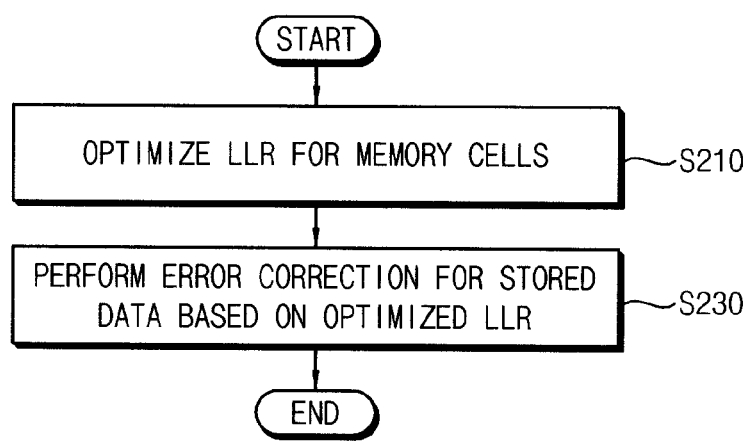
FIG. 9 is a flowchart illustrating a method of correcting errors in a nonvolatile memory device according to example embodiments.

FIG. 9 is a flowchart illustrating the method of correcting errors in the nonvolatile memory device according to example embodiments.

The method of correcting errors in the nonvolatile memory device illustrated in FIG. 9 is applicable to a nonvolatile memory device to perform error correction for data stored in the process of reading out the data. The read-out operation performed in the nonvolatile memory device may include a hard decision read-out operation and/or a soft decision read-out operation. Although the example embodiments will be described hereinafter while focusing on a flash memory device, the method of correcting errors in the nonvolatile memory device according to the example embodiments may be used in a predetermined nonvolatile memory device such as a Phase Change Random Access Memory (PRAM), a Resistance Random Access Memory (RRAM), a Magnetic Random Access Memory (MRAM), and a Ferroelectric random access memory (FRAM).

Referring to FIG. 9, in the method of correcting errors in the nonvolatile memory device according to the example embodiments, an LLR is optimized with respect to a plurality of memory cells included in the nonvolatile memory device (step S210). The method of correcting errors in the nonvolatile memory device according to the example embodiments may be performed through the steps illustrated in FIG. 1. In other words, to optimize the LLR for the memory cells included in the nonvolatile memory device, the variation in the threshold voltage distribution for the memory cells is monitored (step S110), and the LLRs for the memory cells are updated based on the monitoring result (step S130). Since the method of optimizing the LLRs for the memory cells included in the nonvolatile memory device illustrated in FIG. 1 has been described with reference to FIGS. 1 to 8, the details thereof will be omitted in order to avoid redundancy.

Figure 10:
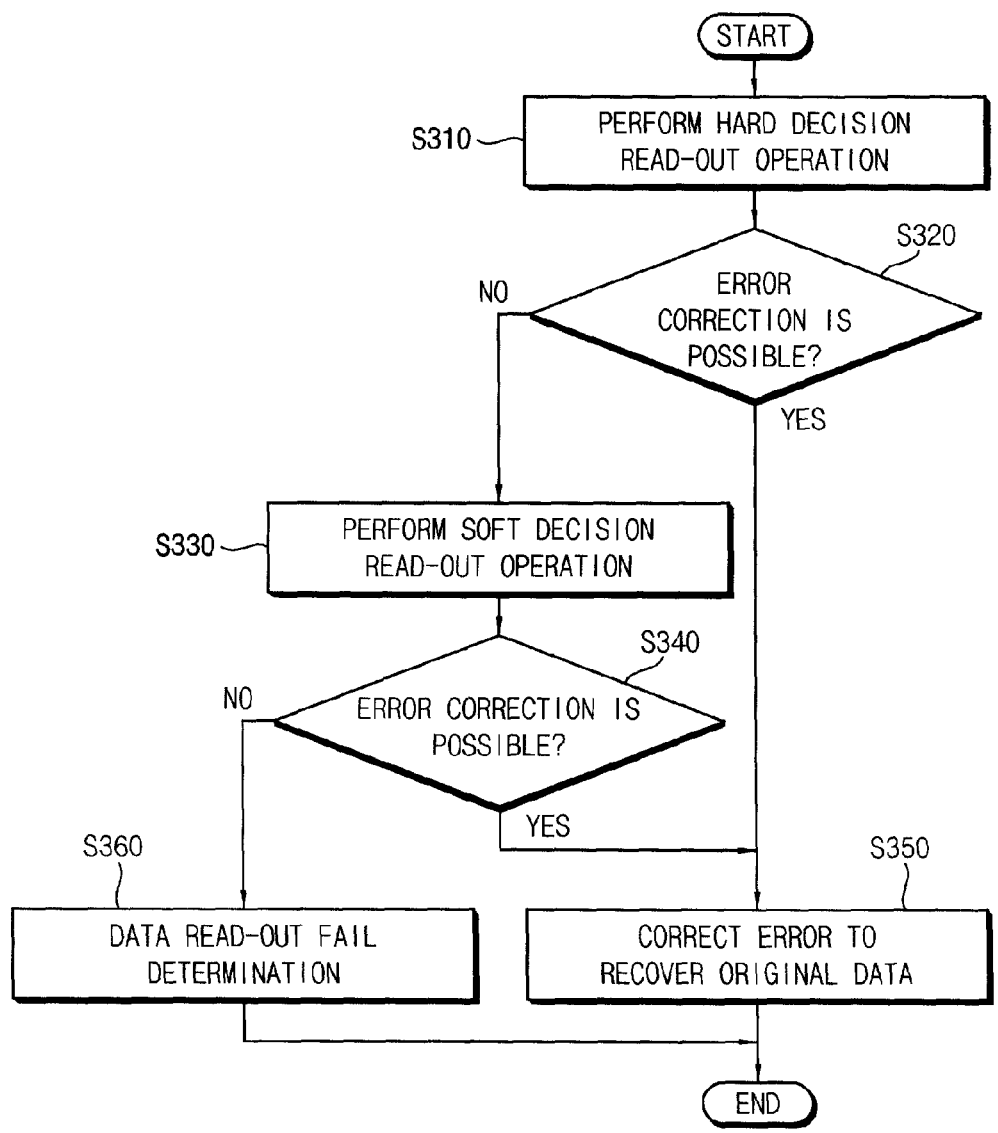
FIG. 10 is a flowchart illustrating an example of a step of performing error correction of data stored in memory cells for the method illustrated in FIG. 9.
Figure 11:
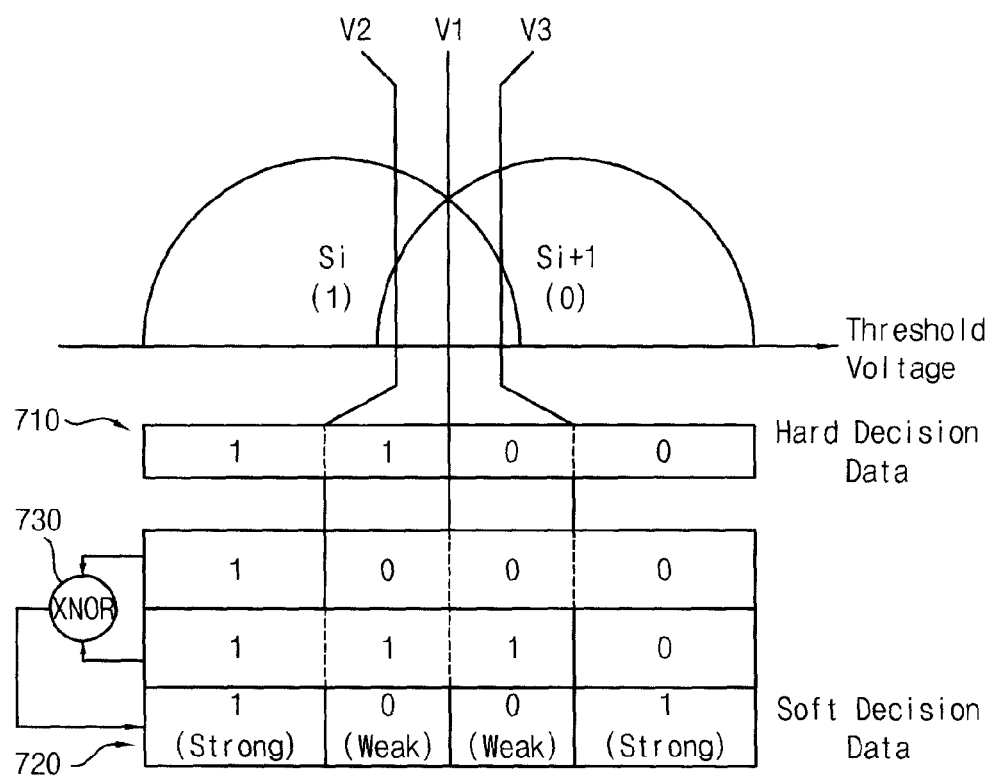
FIG. 11 is a view to explain one example of a 2-bit soft decision read-out operation.
Figure 12:
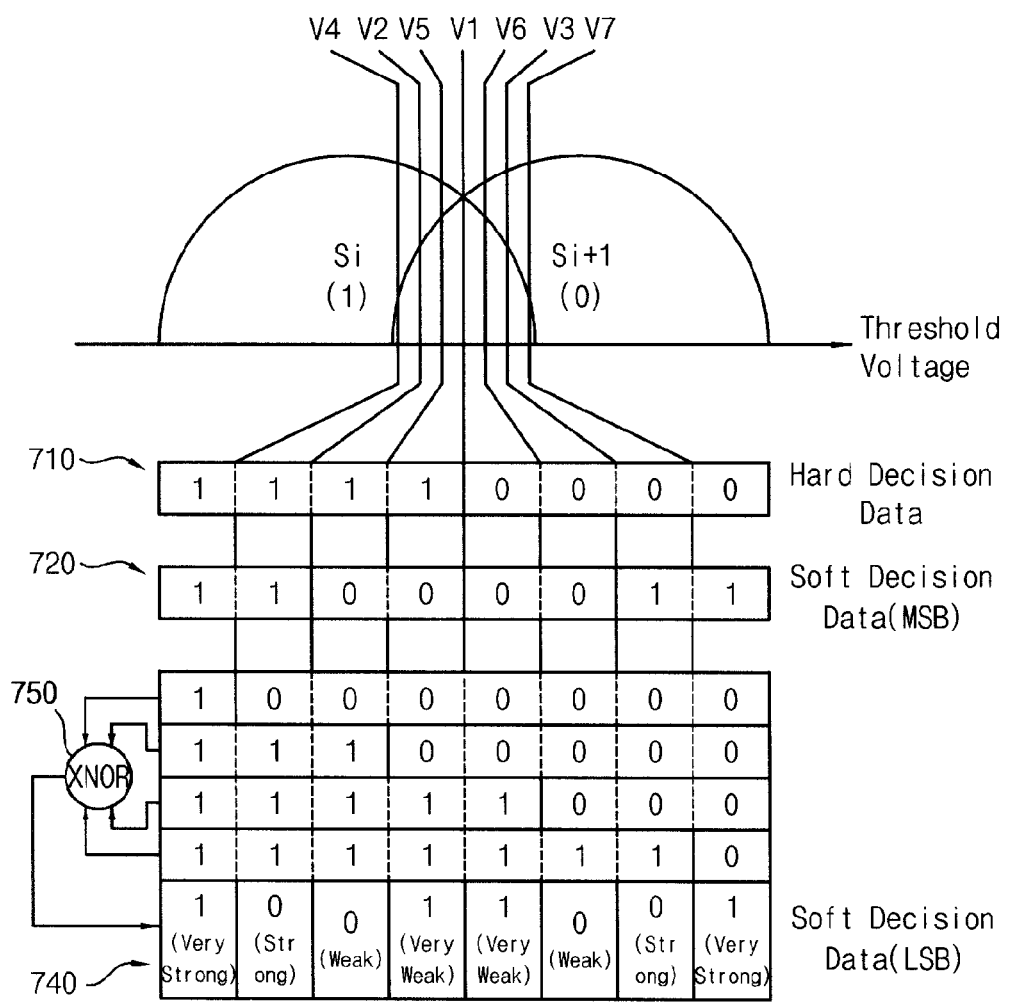
FIG. 12 is a view to explain one example of a 3-bit soft decision read-out operation.
Figure 13A:
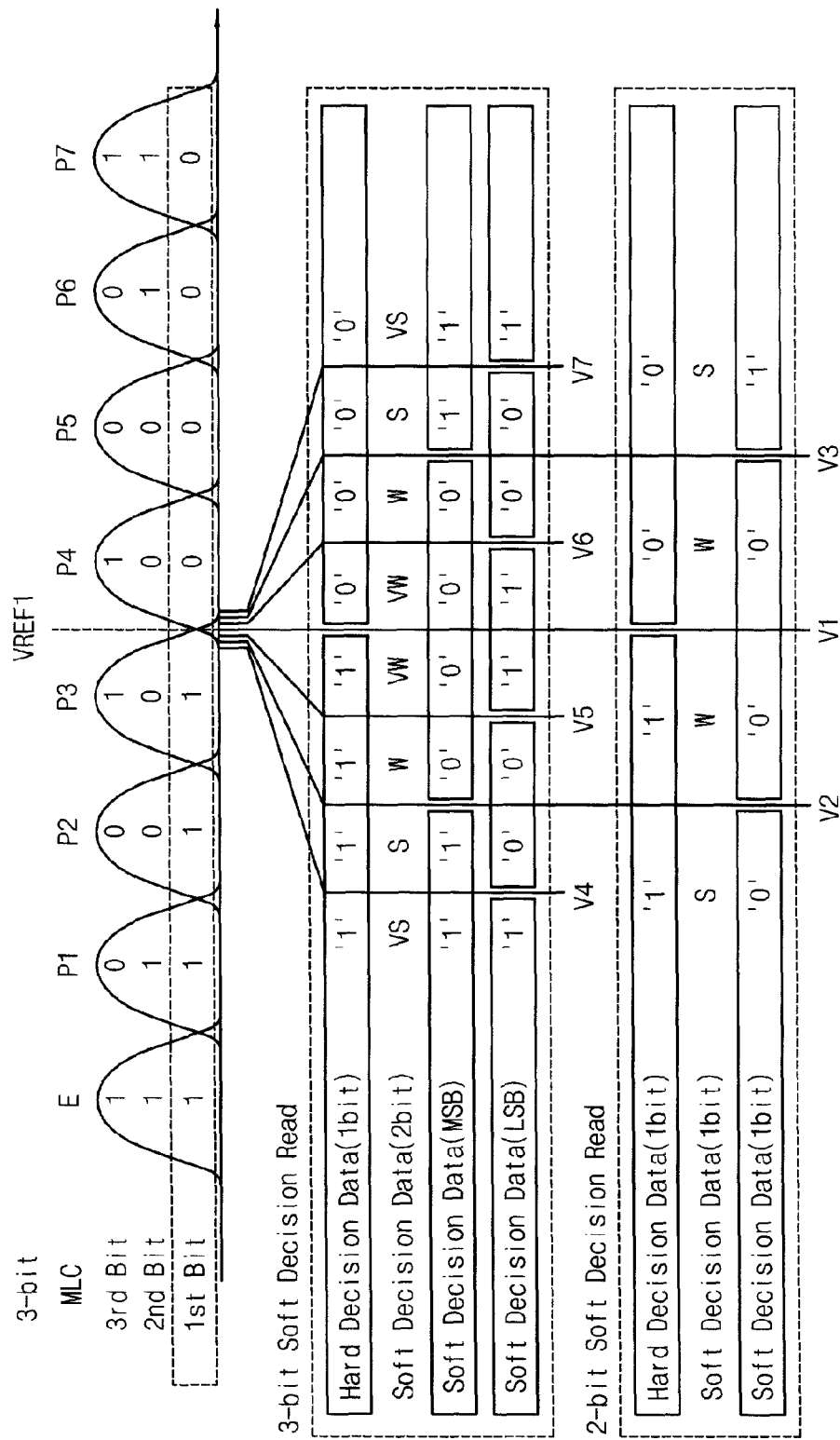
Figure 13C:
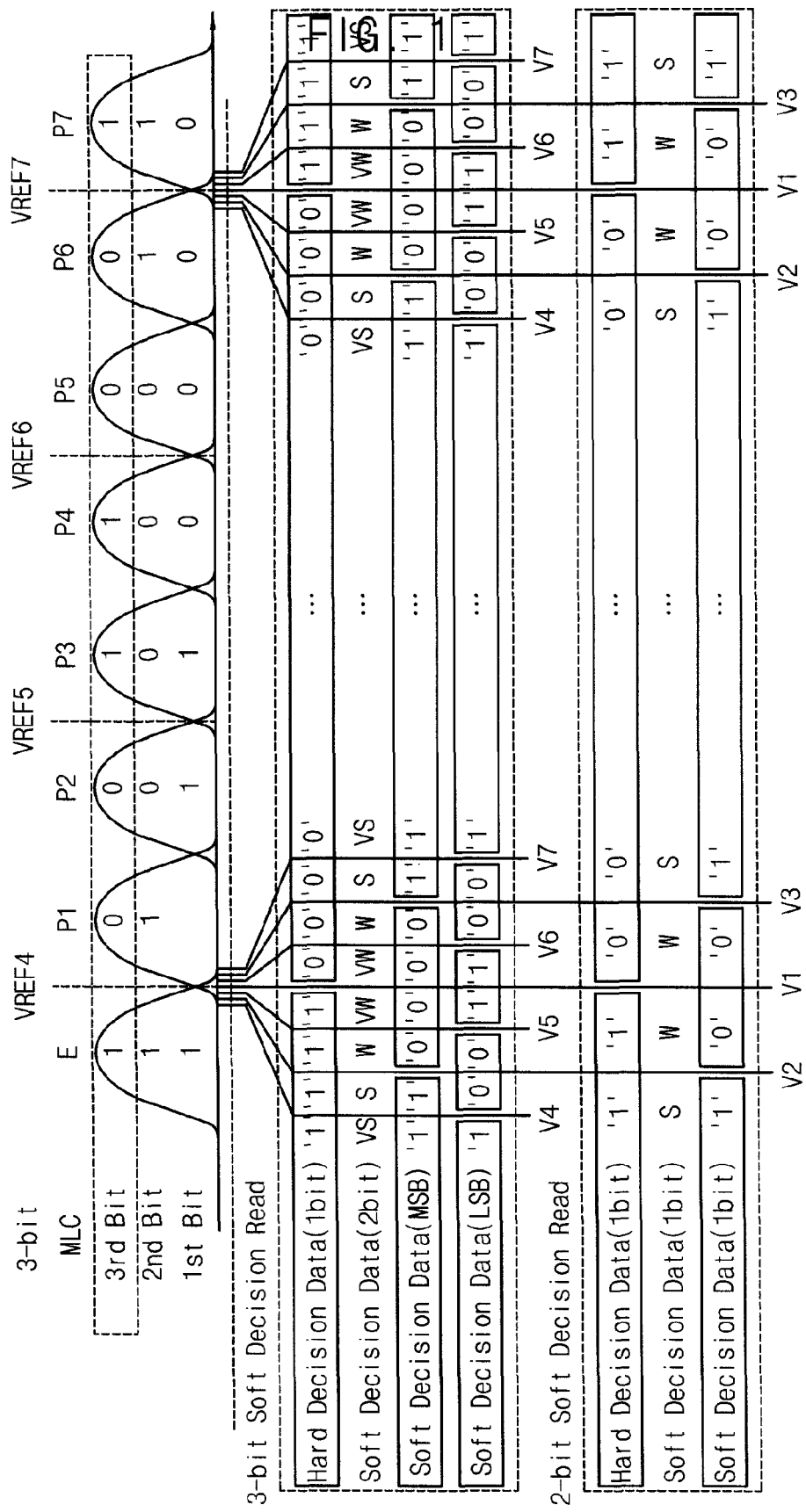

Meanwhile, the error correction for the data stored in the nonvolatile memory device is performed based on the optimized LLR (step S230). FIG. 10 is a flowchart illustrating an example of a step of performing error correction of data stored in memory cells for the method illustrated in FIG. 9. FIG. 11 is a view to explain one example of a 2-bit soft decision read-out operation. FIG. 12 is a view to explain one example of a 3-bit soft decision read-out operation. FIGS. 13A to 13C are views to explain one example of a soft decision read-out operation performed in a nonvolatile memory device including a 3-bit multi-level cell.

FIG. 10 illustrates an example of a procedure of correcting errors by performing the read-out operation for one page of data from a memory device.

According to one embodiment, the read-out operation performed by the nonvolatile memory device-volatile memory device may include a hard decision read-out operation and/or a soft decision read-out operation. The hard decision read-out operation is to read out hard-decision data from the memory cells according to the on/off state of the memory cells connected to a word line by applying a read-out voltage having a predetermined reference level to the word line. A memory controller may perform error correction based on a hard-decision scheme by using the hard-decision data and an error correction code (e.g., Low Density Parity Check code). In addition, the soft decision read-out operation is to read out soft-decision data having the reliability information of the soft-decision data from the memory cells connected to the word line by applying a plurality of read-out voltages to the word line at a predetermined interval. The memory controller may perform error correction based on a soft decision scheme by using the reliability information of the hard-decision data together with the hard-decision data and the error correction code (e.g., LDPC code).

Referring to FIG. 10, the nonvolatile memory device may perform the hard decision operation to read out hard decision data from one selected page (step S310). The nonvolatile memory device may perform the hard decision read-out operation to read out the hard-decision data from the selected page including memory cells connected to a selected word line by applying the first read-out voltage having a predetermined reference level to the selected word line. The nonvolatile memory device may output the hard-decision data to the memory controller, and the memory controller may determine if the errors of the hard-decision data may be corrected by using an error correction code (ECC) (step S320).

If the errors of the hard-decision data cannot be corrected by using the ECC (step S320: "NO"), then the nonvolatile memory device may perform the soft decision read-out operation to read out the soft-decision data of the selected page having the reliability information for the hard-decision data (step S330). The nonvolatile memory device may read out the soft-decision data having the reliability information for the hard-decision data from the selected page including the memory cells connected to the selected word line by applying a plurality of voltages to the selected word line at a predetermined interval.

For example, as illustrated in FIG. 11, the nonvolatile memory device may perform a 2-bit soft decision read-out operation. The 2-bit soft decision read-out operation may include three read-out operations using three voltages V1, V2, and V3 having a predetermined interval therebetween. For example, the three voltages V1, V2, and V3 may include a first voltage V1 having a predetermined reference level to distinguish between the first state Si corresponding to data having a logic value of "1" and the second state Si+1 corresponding to data having a logic value of "0", a second voltage V2 which is less than the first voltage V1 by the predetermined level, and a third voltage V3 which is greater than the first voltage V1 by the predetermined level. Meanwhile, data 710 read out by using the first voltage V1 having the reference level may be hard-decision data 710 read out through the hard decision read-out operation, and the 2-bit soft decision read-out operation may utilize hard-decision data 710 read out through the hard decision read-out operation without applying the first voltage V1 having the reference level. According to the 2-bit soft decision read-out operation, a predetermined logic operation (e.g., an XNOR operation 730, or encoding) may be performed with respect to the data read out by using the second voltage V2 and data read out by using the third voltage V3 to generate soft-decision data 720 having the reliability information for hard-decision data 710. Each bit of soft-decision data 720 may represent the degree of the reliability of the corresponding bit of hard-decision data 710. For example, the bit of soft-decision data 720 having the logic value of "1" represents that the corresponding bit of hard-decision data 710 has strong reliability, and the bit of soft-decision data 720 having the value of "0" represents that the corresponding bit of hard-decision data 710 has weak reliability.

According to another example embodiment, as illustrated in FIG. 12, the nonvolatile memory device may perform a 3-bit soft decision read-out operation. The 3-bit soft decision read-out operation may include seven read-out operations by using seven voltages V1, V2, V3, V4, V5, V6, and V7 having a predetermined interval therebetween. For example, the seven voltages V1, V2, V3, V4, V5, V6, and V7 may include the fourth voltage V4 lower than the second voltage V2, the fifth voltage V5 between the second voltage V2 and the first voltage V1, the sixth voltage V6 between the first voltage V1 and the third voltage V3, and the seventh voltage V7 higher than the third voltage V3 together with three voltages V1, V2, and V3 used in the 2-bit soft decision read-out operation. Data 710 read out by using the first voltage V1 may be 2-bit soft decision read-out operation 710 read out through the hard decision read-out operation. In addition, data 720 read out by using the second and third voltages V2 and V3 may be MSB (most significant bit) soft-decision data 720, and may correspond to soft-decision data 720 read out through the 2-bit soft decision read-out operation. The 3-bit soft decision read-out operation performs a predetermined logic operation (e.g., XNOR operation 750 or encoding) with respect to data read out by using the fourth voltage V4, the fifth voltage V5, the fifth voltage V6, and the seventh voltage V7 to generate LSB soft-decision data 740. Each of soft-decision data 720 and 740 having two bits may represent the degree of the reliability of corresponding hard-decision data 710. For example, each of soft-decision data 720 and 740 having the value of "11" may represent that corresponding hard-decision data 710 have very strong (VS) reliability, each of soft-decision data 720 and 740 having the value of "10" may represent that corresponding hard-decision data 710 has strong (S) reliability, each of soft-decision data 720 and 740 having the value of "00" may represent that corresponding hard-decision data 710 has weak (W) reliability, and each of soft-decision data 720 and 740 having the value of "01" may represent that corresponding hard-decision data 710 has very weak (VW) reliability.

Meanwhile, although FIGS. 11 and 12 illustrate two adjacent states Si and Si+1, the 2-bit soft decision read-out operation and the 3-bit soft decision read-out operation illustrated in FIGS. 11 and 12 may be performed to distinguish between two adjacent states among the plural states. For example, when the memory cells are 3-bit MLCs having 8 states E, P1, P2, P3, P4, P5, P6, and P7 so that each cell stores 3-bit data, the nonvolatile memory device may perform the 2-bit soft decision read-out operation or the 3-bit soft decision read-out operation through schemes illustrated in FIGS. 13A to 13C. FIG. 13A illustrates examples of the 2-bit soft decision read-out operation and the 3-bit soft decision read-out operation performed when reading out the first bit-data (e.g., LSB) stored in the 3-bit MLC by using a first reference read-out voltage VREF1. FIG. 13B illustrates examples of the 2-bit soft decision read-out operation and the 3-bit soft decision read-out operation performed when reading out the second bit-data (e.g., CSB) stored in the 3-bit MLC by using second and third reference read-out voltages VREF2 and VREF3. FIG. 13C illustrates examples of the 2-bit soft decision read-out operation and the 3-bit soft decision read-out operation performed when reading out the third bit-data (e.g., MSB) stored in the 3-bit MLC by using fourth to seventh reference read-out voltages VREF4, VREF5, VREF6, and VREF7.

Referring to FIG. 10, the nonvolatile memory device may output the soft-decision data of the selected page, which are read out through the soft decision read-out operation, to the memory controller, and the memory controller may determine if the errors of the hard-decision data can be corrected based on the reliability information of the soft-decision data (step S340).

If the errors of the hard-decision data cannot be corrected based on the reliability information of the soft-decision data (step S340: "NO"), then the memory controller may make a determination of a data read-out failure with respect to the selected page (step S360).

Meanwhile, the memory controller may perform error correction based on a hard-decision scheme or a soft-decision scheme by using the error correction code, and the hard-decision data and/or the soft-decision data. For example, if the errors of the hard-decision data can be corrected without the reliability information (step S320: "YES"), then the memory controller performs error correction (i.e., ECC decoding) based on the hard-decision scheme with respect to the hard-decision data of the selected page to recover original data (step S350). In addition, if the errors of the hard-decision data can be corrected based on the reliability information of the soft-decision data (step S340: "YES"), then the memory controller performs error correction based on the soft-decision scheme with respect to the hard-decision data of the selected page by using the error correction code, the hard-decision data, and the soft-decision data to recover original data (step S350).

According to one example embodiment, the error correction code used in the error correction operation based on the hard-decision scheme or the soft-decision scheme may be a Low Density Parity Check (LDPC).

As described above with reference to FIGS. 1 to 13C, in the method of correcting errors in the nonvolatile memory device according to the example embodiments, the variation of the threshold voltage distribution resulting from the deterioration in the characteristics of the memory cells is monitored, and the LLR is updated based on the monitoring result. Accordingly, even if the characteristics of the memory cells are deteriorated, the LLR can be continuously maintained at an optimal value. In addition, the nonvolatile memory device performs error correction by using the LDPC code based on the optimized LLR in the process of reading out data, so that the error correction performance and the data read-out performance of the nonvolatile memory device can be improved.

Figure 14:
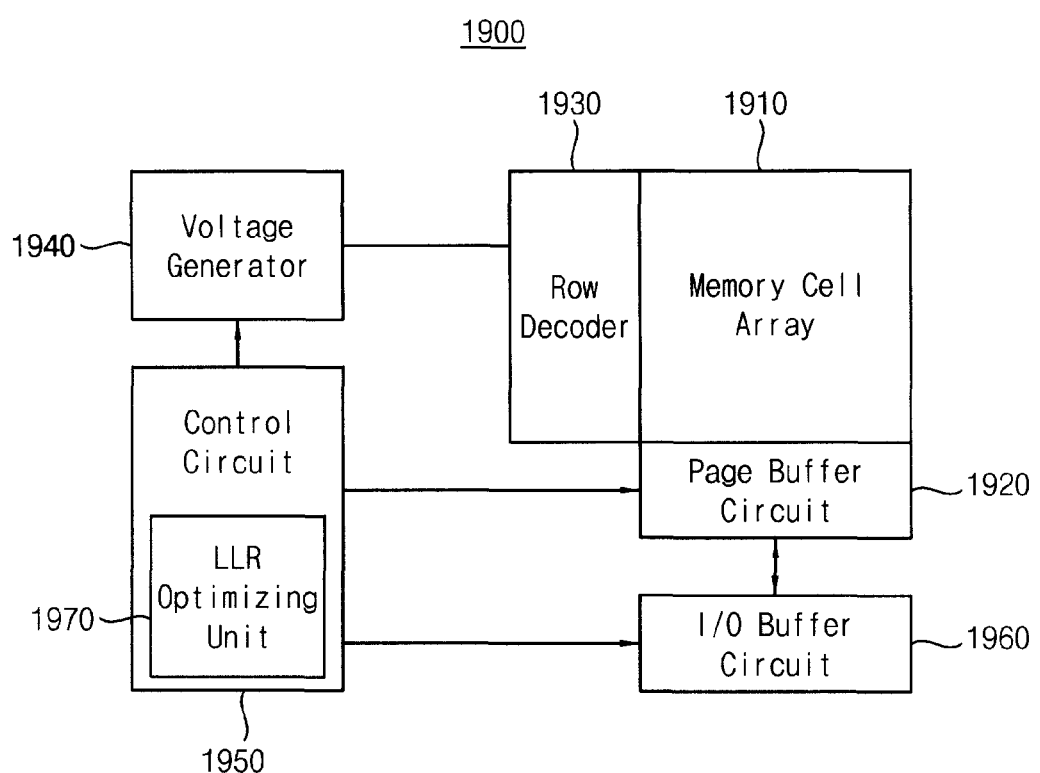
FIG. 14 is a block diagram illustrating a nonvolatile memory device according to example embodiments.

FIG. 14 is a block diagram illustrating a nonvolatile memory device according to example embodiments.

Referring to FIG. 14, a nonvolatile memory device 1900 includes a memory cell array 1910, a page buffer circuit 1920, a row decoder 1930, a voltage generator 1940, an input/output buffer circuit 1960, and a control circuit 1950. According to one example embodiment, nonvolatile memory device 1900 may be a flash memory device. According to another example embodiment, nonvolatile memory device 1900 may be a predetermined nonvolatile memory device such as a Phase Change Random Access Memory (PRAM), a Resistance Random Access Memory (RRAM), a Magnetic Random Access Memory (MRAM), or a Ferroelectric random access memory (FRAM).

Memory cell array 1910 includes a plurality of memory cells connected to a plurality of word lines and a plurality of bit lines, respectively. As described below with reference to FIGS. 15A to 15C, the memory cells may be NAND or NOR-type flash memory cells, respectively, and may be arranged in a 2-D array structure or a 3-D vertical array structure.

According to one example embodiment, each of the memory cells may be a single level memory cell (SLC) to store one data bit, or a multi-level memory cell (MLC) to store a plurality of data bits. In the case of the MLC, the programming scheme in a write mode may include various programming schemes such as a shadow programming scheme, a re-programming scheme, and an on-chip buffered programming scheme.

Page buffer circuit 1920 is connected to the bit lines to store write data to be programmed in memory cell array 1910 or to store read-out data detected from memory cell array 1910. In other words, page buffer circuit 1920 may act as a write driver or a sense amplifier according to the operating modes of flash memory device 1900. For example, page buffer circuit 1920 may act as the write driver in the write mode, and/or act as the sense amplifier in the read-out mode. Input/output buffer circuit 1960 may receive data written in memory cell array 1910 from an external memory controller, or may transmit the data read out from memory cell array 1910 to the memory controller.

Row decoder 1930 is connected to the word lines and may select at least one of the word lines in response to a row address. Voltage generator 1940 may generate word-line voltages, a program voltage, a pass voltage, a verification voltage, an erase voltage, and a read-out voltage according to the control of control circuit 1950. Control circuit 1950 may control page buffer circuit 1920, row decoder 1930, voltage generator 1940 and input/output buffer circuit 1960 to store, erase, and read out data with respect to memory cell array 1910.

According to one example embodiment, nonvolatile memory device 1900 may include an LLR optimizing unit 1970. LLR optimizing unit 1970 may be positioned inside or outside control circuit 1950. LLR optimizing unit 1970 monitors the variation of the threshold voltage distribution for the memory cells included in memory cell array 1910 and updates the LLR for the memory cells based on the monitoring result, so that the LLR for the memory cells can be optimized. The LLR is a value obtained by applying a logarithm (log) to the ratio of probability with which data stored in the memory cells corresponds to "1" or a "0". According to one example embodiment, LLR optimizing unit 1970 may perform an operation of optimizing the LLR for the memory cells in response to a command received from control circuit 1950. According to another embodiment, LLR optimizing unit 1970 may perform the operation of optimizing the LLRs for the memory cells in response to a command received from an external memory controller. LLR optimizing unit 1970 performs the method of optimizing the LLR of the nonvolatile memory device illustrated in FIG. 1, thereby optimizing the LLRs for the memory cells. Since the method of optimizing the LLR of the nonvolatile memory device illustrated in FIG. 1 is described with reference to FIGS. 1 to 8, the details of the operation of LLR optimizing unit 1970 will be omitted.

Whenever LLR optimizing unit 1970 performs the operation of optimizing the LLR for the memory cells, control circuit 1950 may provide the optimized LLR to the memory controller. The memory controller may perform error correction with respect to data stored in nonvolatile memory device 1900 based on the optimized LLR in the process of reading out data from nonvolatile memory device 1900. For example, the memory controller may perform error correction by using an LDPC code based on the optimized LLR. Accordingly, the error correction performance and data read-out performance of the nonvolatile memory device can be improved.

As described below with reference to FIGS. 16 and 17, LLR optimizing unit 1970 may be positioned in the memory controller.

Figure 15A:
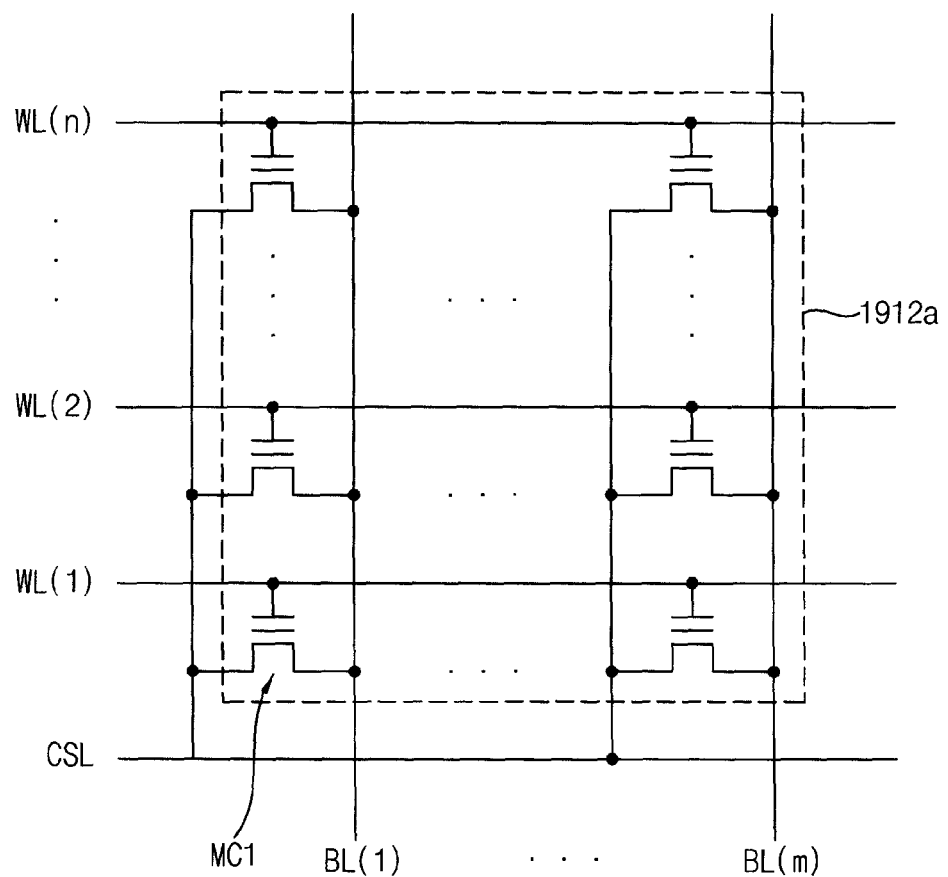
FIGS. 15A, 15B, and 15C are views illustrating examples of a memory cell array included in the nonvolatile memory device of FIG. 14.
Figure 15B:
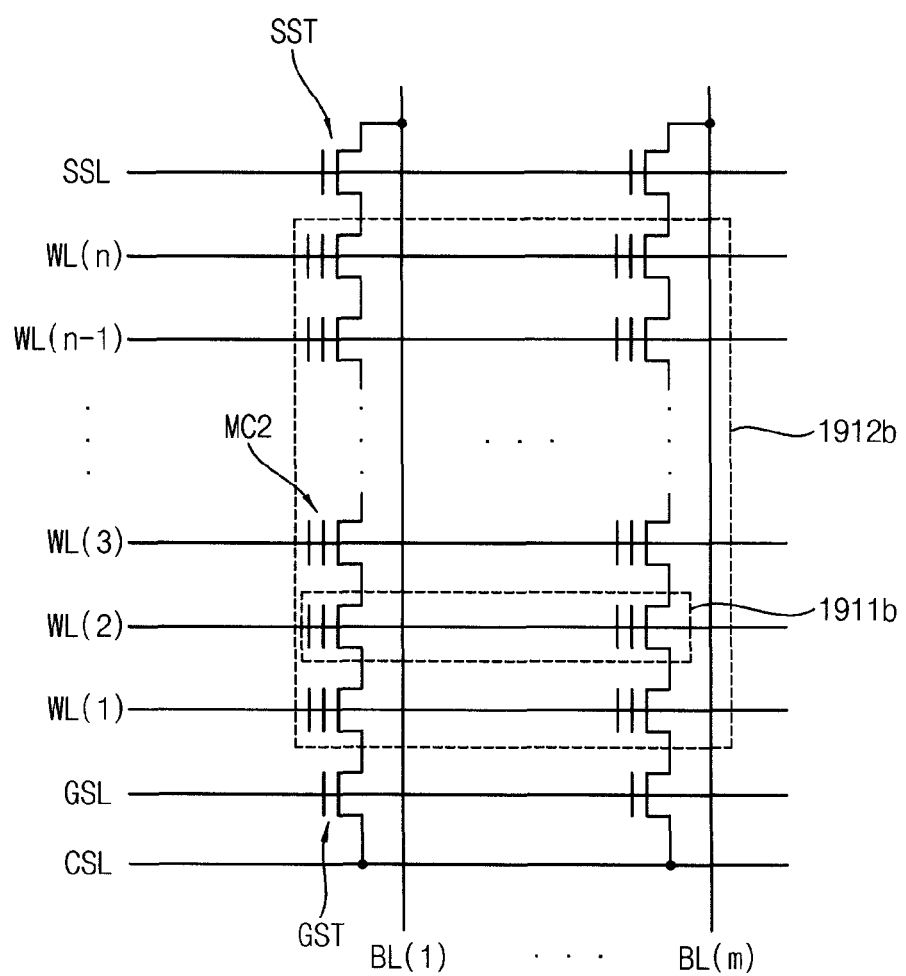
Figure 15C:
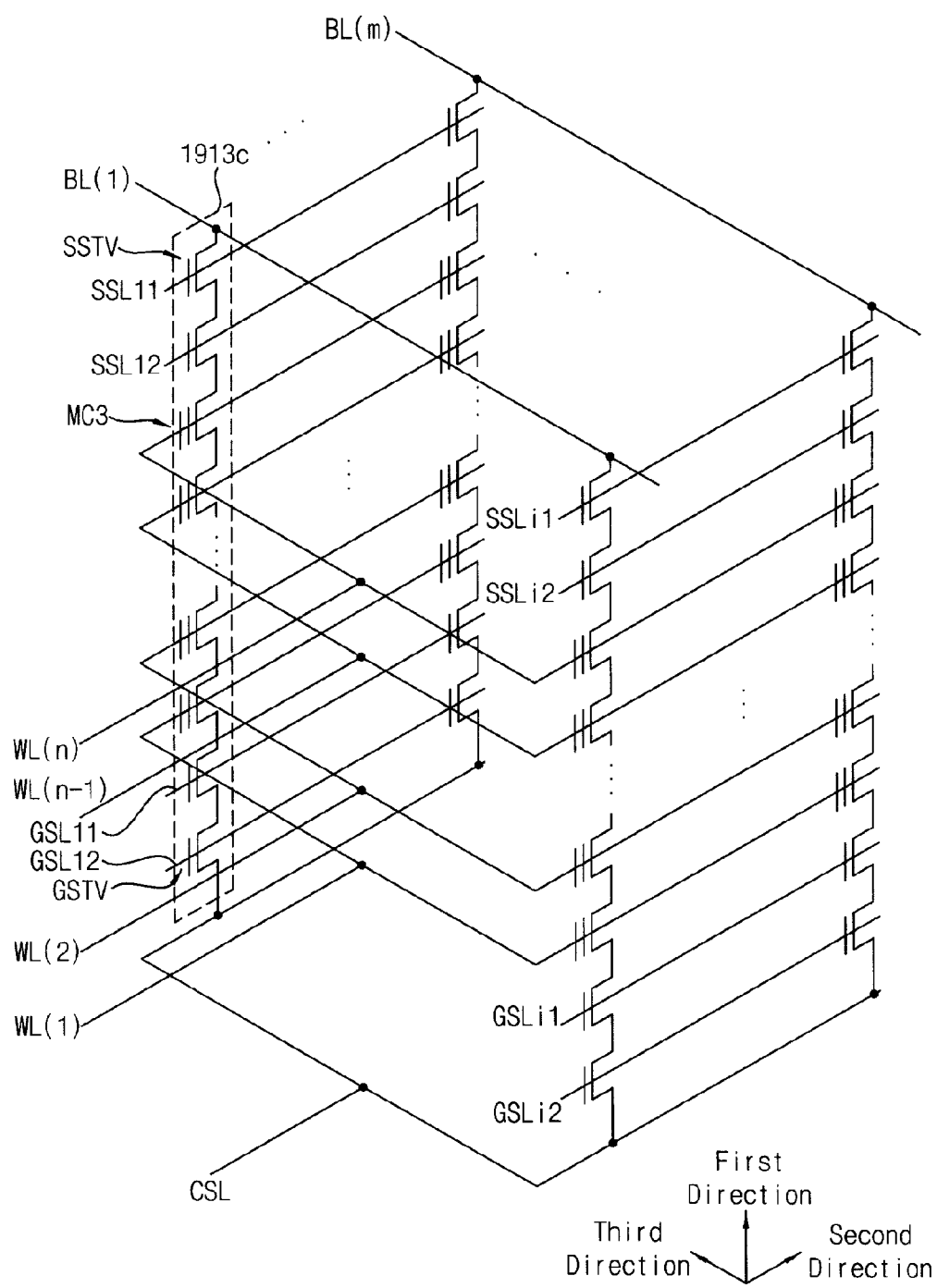

FIGS. 15A, 15B, and 15C are circuit diagrams illustrating examples of the memory cells included in the nonvolatile memory device of FIG. 14.

FIG. 15A is a circuit diagram illustrating a memory cell array included in a NOR-type flash memory device, FIG. 15B is a circuit diagram illustrating one example of a memory cell array included in a NAND-type flash memory device, and FIG. 15C is a circuit diagram illustrating one example of a memory cell array included in a vertical-type flash memory device.

Referring to FIG. 15A, memory cell array 1910a may include a plurality of memory cells MC1. The memory cells MC1 arranged in the same column may be provided in parallel between one of bit lines BL(1), . . . , and BL(m) and a common source line CSL, and the memory cells MC1 arranged in the same row may be commonly connected to one of the word lines WL(1), WL(2), . . . , and WL(n). For example, the memory cells MC1 arranged in a first column may be provided in parallel between the first bit line BL(1) and the common source line CSL. Gate electrodes of the memory cells MC1 arranged in a first row may be commonly connected to the first word line WL(1). The memory cells MC1 may be controlled according to the level of the voltage applied to the word lines WL(1), . . . , and WL(n). The NOR-type flash memory device including memory cell array 1910a may perform a write operation and a read-out operation in the unit of a byte or the unit of a word, and perform an erase operation in the unit of a block 1912a.

Referring to FIG. 15B, a memory cell array 1910b may include string select transistors SST, ground select transistors GST, and memory cells MC2. The string select transistors SST are connected to the bit lines BL(1), . . . , and BL(m), and the ground select transistors GST may be connected to the common source line CSL. The memory cells MC2 arranged in the same column may be provided in series between one of the bit lines BL(1), . . . , and BL(m) and the common source line CSL, and the memory cells MC2 arranged in the same row may be commonly connected to one of word lines WL(1), WL(2), WL(3), . . . , WL(n−1), and WL(n). In other words, the memory cells MC2 may be connected in series between the string select transistors SST and the ground select transistors GST, and 16, 32, or 64 word lines may be arranged between the string select line SSL and the ground select line GSL.

The string select transistors SST are connected to a string select line SSL, so that the string select transistors SST may be controlled according to the level of a voltage applied thereto from the string select line SSL. The ground select transistors GST are connected to a ground select line GSL, so that the ground select transistors GST may be controlled according to the level of a voltage applied thereto from the ground select line GSL. The memory cells MC2 may be controlled according to the level of the voltage applied to the word lines WL(1), . . . , and WL(n).

The NAND-type flash memory device including memory cell array 1910b may perform a write operation and a read-out operation in the unit of a page 1911b, and may perform an erase operation in the unit of a block 1912b. Meanwhile, according to one example embodiment, each of page buffers may be connected to one even-numbered bit line and one odd-numbered bit line. In this case, even-numbered bit lines form even-numbered pages, and odd-numbered bit lines form odd-numbered pages. The write operations for the memory cells MC2 may be sequentially performed by alternating the even-numbered page and the odd-numbered page.

Referring to FIG. 15C, a memory cell array 1910c may include a plurality of strings 1913c having a vertical structure. A plurality of strings 1913c may be formed in a second direction to form a string row, and a plurality of string rows may be formed in a third direction to form a string array. Each of strings 1913c may include ground select transistors GSTV, memory cells MC3, and string select transistors SSTV provided in series in a first direction between the bit lines BL(1), . . . , and BL(m) and the common source line CSL.

The ground select transistors GSTV are connected to ground select lines GSL11, GSL12, . . . , GSLi1, and GSLi2, and the string select transistors SSTV may be connected to the string select lines SSL11, SSL12, . . . , SSLi1, and SSLi2. The memory cells MC3 arranged at the same layer may be commonly connected to one of the word lines WL(1), WL(2), . . . , WL(n−1), and WL(n). The ground select lines GSL11, . . . , and GSLi2 and the string select lines SSL11, . . . , and SSLi2 extend in the second direction, and may be plurally formed in the third direction. The word lines WL(1), . . . , and WL(n) extend in the second direction and may be plurally formed in the first and third directions. The bit lines BL(1), . . . , and BL(m) extend in the third direction, and may be plurally formed in the second direction. The memory cells MC3 may be controlled according to the level of a voltage applied to the word lines WL(1), . . . , and WL(n).

Since the vertical-type flash memory device including the memory cell array 1910c includes NAND-type flash memory cells, the vertical-type flash memory device performs a write operation and a read-out operation in the unit of a page, and performs an erase operation in the unit of a block similarly to the NAND-type flash memory device.

According to an example embodiment, implementation may be performed in such a manner that two string select transistors included in one string 1913c are connected to one string select line, and two ground select transistors included in one string are connected to one ground select line. In addition, according to the example embodiment, one string may be implemented in such a manner that one string includes one string select transistor and one ground select transistor.

Figure 16:
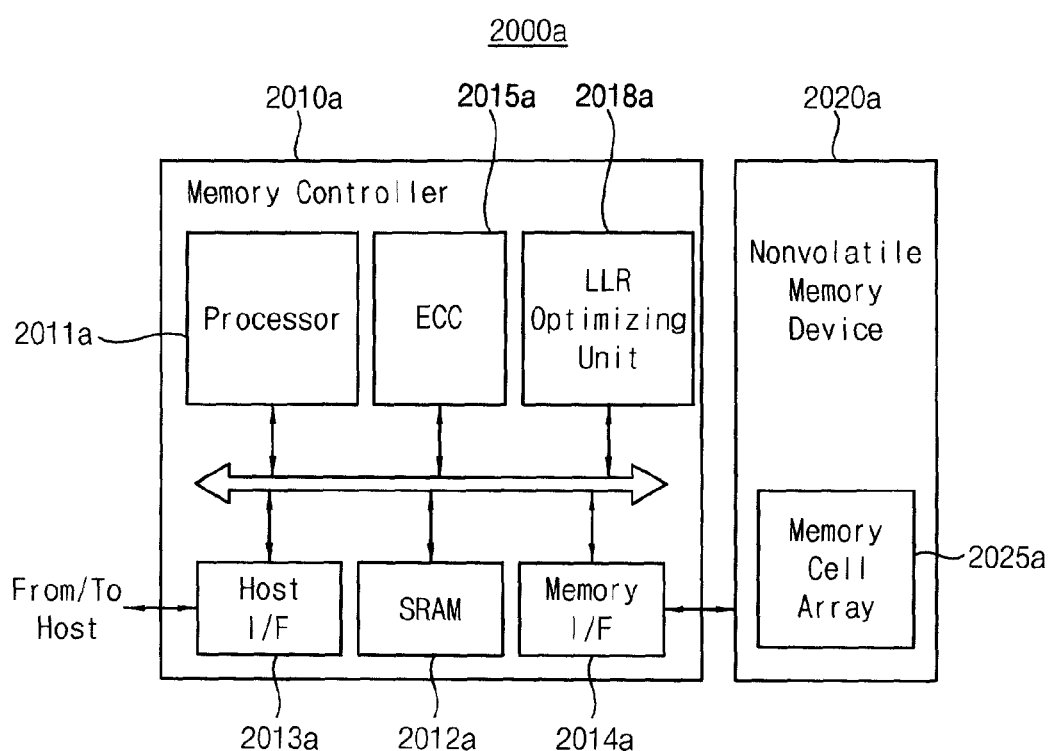
FIG. 16 is a block diagram illustrating one example of a memory system including a nonvolatile memory device and a memory controller according to an example embodiment.

FIG. 16 is a block diagram illustrating one example of a memory system including a nonvolatile memory device and a memory controller according to an example embodiment.

Referring to FIG. 16, a memory system 2000a includes a memory controller 2010a and a nonvolatile memory device 2020a.

Nonvolatile memory device 2020a may include a memory cell array 2025a having a plurality of memory cells to store data. Memory controller 2010a controls the nonvolatile memory device 2020a. Memory controller 2010a may control the data exchange between an external host and nonvolatile memory device 2020a. Memory controller 2010a may include a processor 2011a such as a central process unit (CPU), a buffer memory 2012a, a host interface 2013a, a memory interface 2014a, an ECC block 2015a, and an LLR optimizing unit 2018a. Processor 2011a may perform the operation for the data exchange. According to one example embodiment, buffer memory 2012a may be implemented by using a static random access memory (SRAM). According to other example embodiments, buffer memory 2012a may be implemented by using a Dynamic random access memory (DRAM), a PRAM, an FRAM, an RRAM, or an MRAM. According to the example embodiment, buffer memory 2012a may be positioned inside or outside memory controller 2010a.

Host interface 2013a is connected to the host (not shown in FIG. 16), and memory interface 2014a s connected to nonvolatile memory device 2020a. Processor 2011a may make communication with the host through the host interface 2013a. For example, host interface 2013a is configured to make communication with the host through at least one of various interface protocols such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (EDSI), and Integrated Drive Electronics (IDE). In addition, processor 2011a may make communication with nonvolatile memory device 2020a through memory interface 2014a.

LLR optimizing unit 2018a monitors the variation of the threshold voltage distribution for the memory cells included in memory cell array 2025a and updates the LLR for the memory cells based on the monitoring result, thereby optimizing the LLR for the memory cells. LLR optimizing unit 2018a performs the method of optimizing the LLR of the nonvolatile memory device illustrated in FIG. 1, so that the LLR for the memory cells can be optimized. Since the method of optimizing the LLR used in the nonvolatile memory device illustrated in FIG. 1 has been described with reference to FIGS. 1 to 8, the details of the operation of LLR optimizing unit 2018a will be omitted.

ECC block 2015a performs an ECC encoding operation with respect to data provided from the host and provides the data to nonvolatile memory device 2020a. ECC block 2015a performs an ECC decoding operation with respect to data read out from nonvolatile memory device 2020a and provides the data to the host. According to one example embodiment, ECC block 2015a may perform the ECC encoding operation and the ECC decoding operation by using an LDPC code.

When ECC block 2015a reads out data from nonvolatile memory device 2020a, ECC block 2015a may perform error correction for data stored in nonvolatile memory device 2020a based on the optimized LLR provided from LLR optimizing unit 2018a. For example, ECC block 2015a may perform error correction by using the LDPC code based on the optimized LLR. Accordingly, the error correction performance and the data read-out performance of nonvolatile memory device 2020a can be improved.

According to the example embodiment, memory controller 2010a may be built in nonvolatile memory device 2020a to be implemented, or memory controller 2010a and nonvolatile memory device 2020a may be implemented in separate chips.

Memory system 2000a may be implemented in the form of a memory card or a solid state drive. Nonvolatile memory device 2020a, memory controller 2010a, and/or memory system 2000a may be implemented by using various shape packages such as Package on Package (POP), Ball grid arrays (BGAs), Chip scale packages (SCPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSPOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

Figure 17:
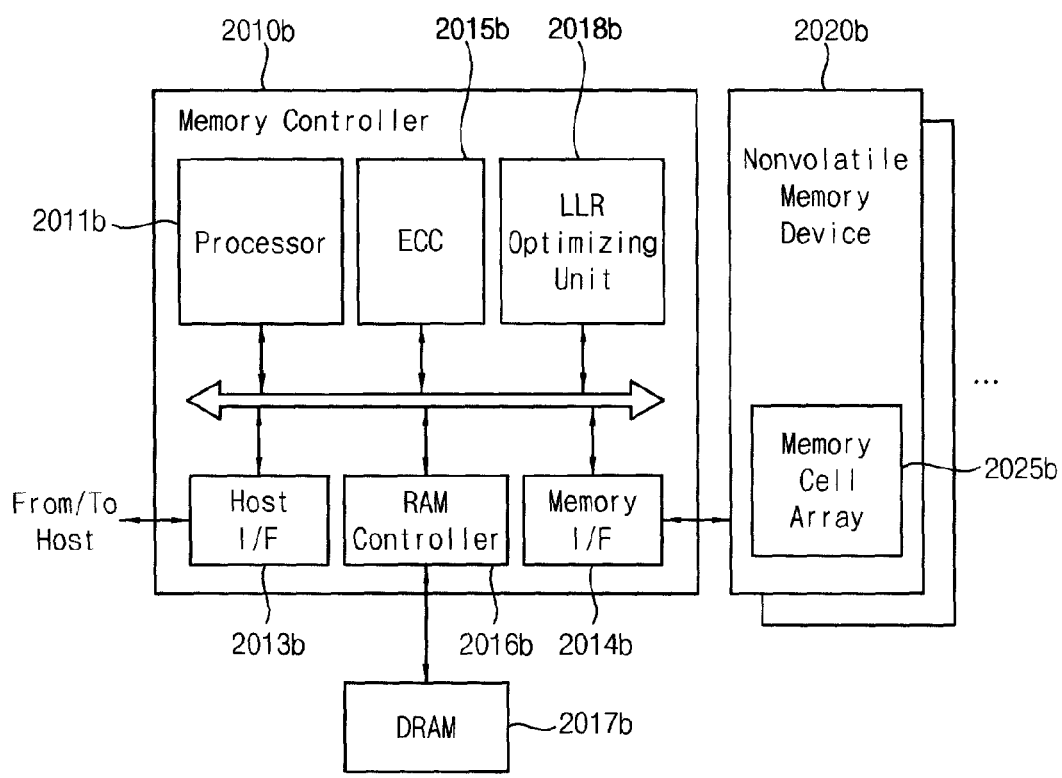
FIG. 17 is a block diagram illustrating another example of a memory system including a nonvolatile memory device and a memory controller according to example embodiments.

FIG. 17 is a block diagram illustrating another example of a memory system including a nonvolatile memory device and a memory controller according to example embodiments.

Referring to FIG. 17, a memory system 2000b includes a memory controller 2010b, at least one nonvolatile memory device 2020b, and a buffer memory 2017b. According to one example embodiment, buffer memory 2017b may be implemented by using a DRAM (Dynamic random access memory), and may be positioned outside memory controller 2010b. Nonvolatile memory device 2020b includes a memory cell array 2025b, and memory controller 2010b may include a RAM (Random Access Memory) controller 2016b to control a processor 2011b, a host interface 2013b, a memory interface 2014b, an ECC block 2015b, an LLR optimizing unit 2018b, and a buffer memory 2017b. Memory system 2000b of FIG. 17 may have the configuration and the operation substantially similar to those of memory system 2000a of FIG. 16 except that buffer memory 2017b is positioned outside memory controller 2010b.

Figure 18:
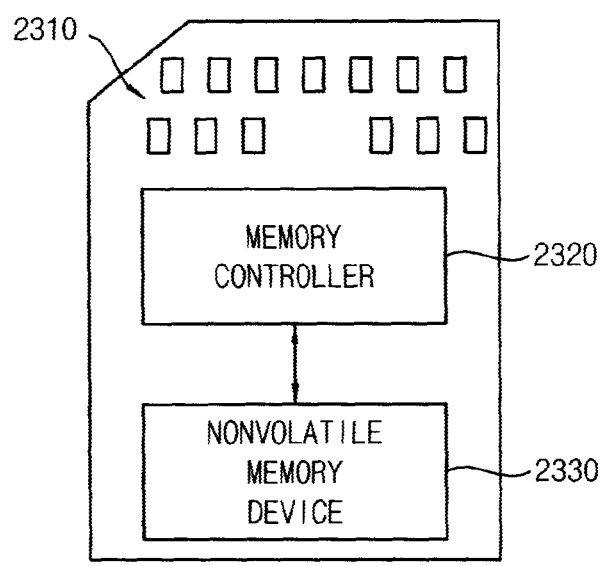
FIG. 18 is a view illustrating an example in which a memory system according to example embodiments is applied to a memory card.

FIG. 18 is a view illustrating an example in which a memory system according to the example embodiment is applied to a memory card.

Referring to FIG. 18, a memory card 2300 includes a plurality of connection pins 2310, a memory controller 2320, and a nonvolatile memory device 2330.

Connection pins 2310 may be connected to the host such that signals are transceived between the host and memory card 2300. Connection pins 2310 may include a clock pin, a command pin, a data pin and/or a reset pin.

Memory controller 2320 may receive data from the host, and may store the received data in nonvolatile memory device 2330.

Nonvolatile memory device 2330 may include a memory cell array having a plurality of memory cells.

Memory controller 2320 monitors the variation of the threshold voltage distribution for the memory cells and updates the LLR for the memory cells based on the monitoring result, thereby optimizing the LLRs for the memory cells. In addition, memory controller 2320 may perform error correction for data stored in nonvolatile memory device 2330 based on the optimized LLR in the process of reading out data from nonvolatile memory device 2330. For example, memory controller 2320 may perform error correction by using the LDPC code based on the optimized LLR. Accordingly, the error correction performance and the data read-out performance of memory card 2300 can be improved.

A memory system including memory controller 2320 and nonvolatile memory device 2330 may be implemented by using memory system 2000a illustrated in FIG. 16. Since the configuration and the operation of memory system 2000a illustrated in FIG. 16 has been described, the details of the configurations and the operations of memory controller 2320 and nonvolatile memory device 2330 will be omitted.

Memory card 2300 may include an MMC (MultiMedia Card), an eMMC (embedded MultiMedia Card), a hybrid eMMC (hybrid embedded MultiMedia Card), an SD (Secure Digital) card, a micro-SD card, a memory stick, an ID card, a PCMCIA (Personal Computer Memory Card International Association) card, a chip card, a USB card, a smart card, and a CF card (Compact Flash Card).

According to the example embodiment, memory card 2300 may be installed in a host such as a computer, a laptop, a cellular, a smart phone, an MP3 player, a PDA (Personal Digital Assistants), a PMP (Portable Multimedia Player), a digital TV, a digital camera, and a portable game console.

Figure 19:
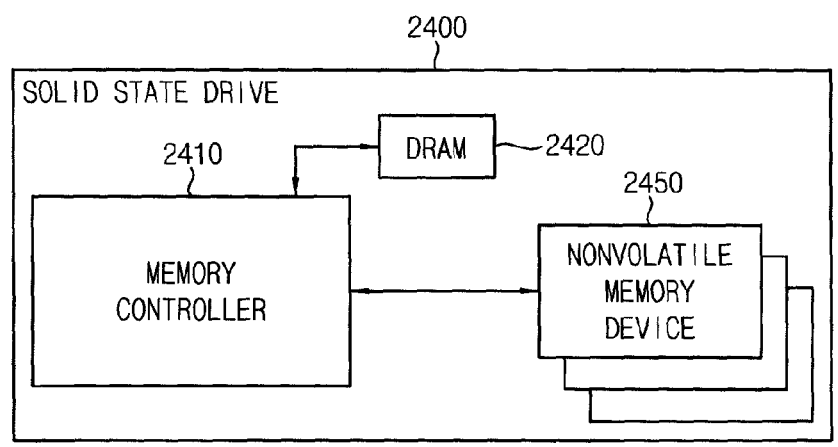
FIG. 19 is a view illustrating an example in which the memory system according to example embodiments is applied to a solid state drive.

FIG. 19 is a view illustrating an example in which the memory system according to the example embodiments is applied to a solid state drive (SSD).

Referring to FIG. 19, an SSD 2400 includes a memory controller 2410, a buffer memory 2420, and a plurality of nonvolatile memory devices 2450.

Memory controller 2410 may receive data from a host (not illustrated) and store the received data in nonvolatile memory devices 2450. Buffer memory 2420 may temporarily store data exchanged between the host and nonvolatile memory devices 2450, and may be implemented as a dynamic random access memory (DRAM) positioned outside memory controller 2410.

Memory controller 2410 can monitor the variation of the threshold voltage distribution for the memory cells included in each nonvolatile memory device 2450 and update the LLR for the memory cells based on the monitoring result, thereby optimizing the LLRs for the memory cells. In addition, memory controller 2410 can perform error correction for data stored in nonvolatile memory device 2450 based on the optimized LLR in the process of reading out data from each nonvolatile memory device 2450. For example, memory controller 2410 may perform error correction by using an LDPC code based on the optimized LLR. Accordingly, the error correction performance and the data read-out performance of SSD 2400 can be improved.

The memory system including memory controller 2410, buffer memory 2420, and nonvolatile memory devices 2450 may be implemented as memory system 2000b illustrated in FIG. 17. Since the configuration and the operation for memory system 2000b illustrated in FIG. 17 have been described, the details of the configuration and the operation in memory controller 2410, buffer memory 2420, and a plurality of nonvolatile memory devices 2450 will be omitted.

According to the example embodiment, SSD 2400 may be installed in a host such as a computer, a laptop, a cellular, a smart phone, an MP3 player, a PDA, a PMP, a digital TV, a digital camera, and a portable game console.

Figure 20:
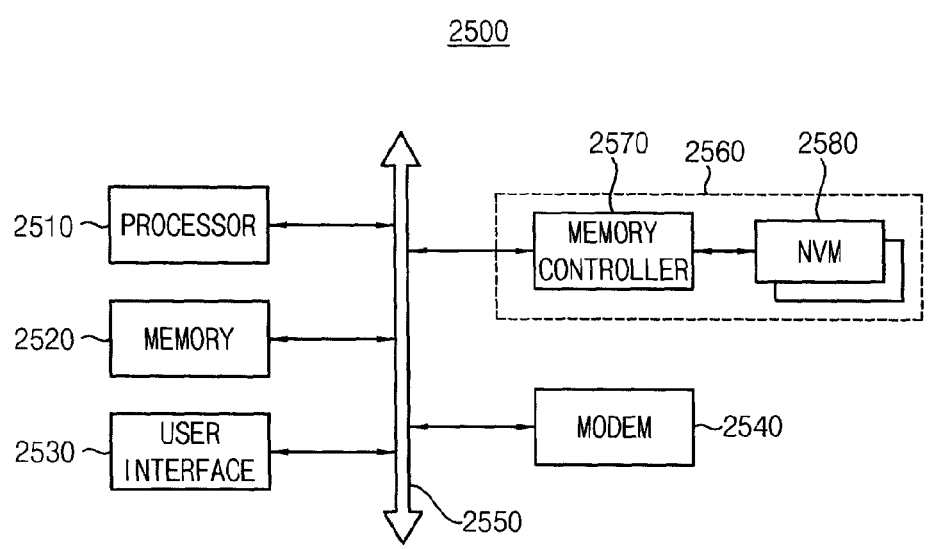
FIG. 20 is a block diagram illustrating a computing system according to example embodiments.

FIG. 20 is a block diagram illustrating a computing system according to example embodiments.

Referring to FIG. 20, a computing system 2500 includes a processor 2510, a memory device 2520, a user interface 2530, a bus 2550, and a memory system 2560. According to the example embodiment, computing system 2500 may further include a MODEM 2540 such as a baseband chipset.

Processor 2510 may execute specific computations or specific tasks. For example, processor 2510 may be a micro-processor or a central process unit (CPU). Processor 2510 may be connected to memory device 2520 through bus 2550 such as an address bus, a control bus, and/or a data bus. For example, memory device 2520 may be implemented by using a DRAM, a mobile DRAM, an SRAM, a PRAM, an FRAM, an RRAM, and/or an MRAM.

In addition, processor 2510 may be connected to an expansion bus such as a PCI (Peripheral Component Interconnect) bus. Accordingly, processor 2510 may control user interface 2530 including at least one input device such as a keyboard or a mouse or at least one output device such as a printer or a display device. MODEM 2540 may wirelessly transceive data together with an external device.

Nonvolatile memory device 2580 of memory system 2560 may store data processed by processor 2510 or data received through MODEM 2540 through memory controller 2570.

Memory controller 2570 monitors the variation of the threshold voltage distribution for the memory cells included in nonvolatile memory device 2580 and updates the LLRs for the memory cells based on the monitoring result, thereby optimizing the LLR for the memory cells. In addition, memory controller 2570 may perform error correction for data stored in nonvolatile memory device 2580 based on the optimized LLR in the process of reading out data from nonvolatile memory device 2580. For example, memory controller 2570 may perform error correction by using an LDPC code based on the optimized LLR. Accordingly, the error correction performance and the data read-out performance of memory system 2560 can be improved.

Memory system 2560 may be implemented as memory system 2000*a* illustrated in FIG. 16. Since the configuration and the operation of memory system 2000*a* illustrated in FIG. 16 have been described, the details of the configuration and the operation of memory system 2560 will be omitted.

Computing system 2500 may further include a power supply to supply the operating voltage. Further, according to the example embodiment, computing system 2500 may further include an application chipset and an image processor.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of optimizing a log likelihood ratio (LLR) used to correct errors related to data stored in a nonvolatile memory device, the method comprising:
    monitoring a variation of a threshold voltage distribution for a plurality of memory cells included in the nonvolatile memory device; and
    updating the LLR for the memory cells based on a result of the monitoring,
    wherein the monitoring of the variation of the threshold voltage distribution comprises:
    detecting a present threshold voltage distribution for the memory cells, and
    estimating a variation direction and a variation degree of the variation of the threshold voltage distribution, including comparing a previously-stored initial threshold voltage distribution for the memory cells with the present threshold voltage distribution.

2. The method of claim 1, wherein the initial threshold voltage distribution corresponds to a number of first memory cells, among the memory cells included in the nonvolatile memory device, having a threshold voltage which is less than a first voltage in an initial stage of an operation of the nonvolatile memory device and a number of second memory cells, among the memory cells included in the nonvolatile memory device, having a threshold voltage which is greater than a second voltage in the initial stage of the operation of the nonvolatile memory device among the memory cells, and the present threshold voltage distribution corresponds to a number of third memory cells, among the memory cells included in the nonvolatile memory device, having a threshold voltage which is less than the first voltage in a present state of the nonvolatile memory device and a number of fourth memory cells, among the memory cells in the nonvolatile memory device, having a threshold voltage which is greater than the second voltage in the present state of the nonvolatile memory device.

3. The method of claim 2, wherein each of the memory cells is a single level memory cell (SLC) to store one data bit therein, and
    the first voltage is a voltage corresponding to an erased state, and the second voltage is a voltage corresponding to a programmed state.

4. The method of claim 2, wherein each of the memory cells is a multi-level memory cell (MLC) to store a plurality of data bits therein; and
    the first voltage is a voltage corresponding to an erased state, and the second voltage is a voltage corresponding to a programmed state having a highest level.

5. The method of claim 4, wherein the MLC is a 2-bit memory cell to store 2-bit data, or a 3-bit memory cell to store 3-bit data.

6. The method of claim 1, wherein the estimating is based on a difference between a number of first memory cells, among the plural memory cells of the nonvolatile memory device, having a threshold voltage between a first voltage and a second voltage in a present state of the nonvolatile memory device and a number of second memory cells, among the memory cells of the nonvolatile memory device, having a threshold voltage between the first voltage and a third voltage in the present state.

7. The method of claim 6, wherein the first voltage is a voltage corresponding to a hard decision read-out operation, and the second and third voltages are voltages corresponding to a soft decision read-out operation.

8. The method of claim 1, wherein the threshold voltage distribution is varied due to at least one of a disturbance between adjacent memory cells and an elapse of a data retention time.

9. The method of claim 8, wherein the threshold voltage distribution is moved in a first direction due to the disturbance between the adjacent memory cells, and moved in a second direction different from the first direction due to the elapse of the data retention time.

10. A method of correcting errors related to data when reading out the data stored in a nonvolatile memory device, the method comprising:
    optimizing a log-likelihood ratio (LLR) for a plurality of memory cells included in the nonvolatile memory device; and
    performing error correction for the stored data based on the optimized LLR,
    wherein the optimizing of the LLR comprises:
    monitoring a variation of a threshold voltage distribution for the memory cells; and
    updating the LLR for the memory cells based on a result of the monitoring,
    wherein the monitoring of the variation of the threshold voltage distribution comprises:
    detecting a present threshold voltage distribution for the memory cells, and
    estimating a variation direction and a variation degree of the variation of the threshold voltage distribution, including comparing a previously-stored initial threshold voltage distribution for the memory cells with the present threshold voltage distribution.

11. The method of claim 10, wherein the performing of the error correction for the stored data comprises:
performing error correction for the stored data by using a low density parity check (LDPC) code.

12. The method of claim 10, wherein the optimizing of the LLR and the performing of the error correction are performed with a memory controller provided outside the nonvolatile memory device.

13. The method of claim 10, wherein the nonvolatile memory device is a vertical-type memory device in which a plurality of word lines are vertically stacked.

14. The method of claim 10, wherein the nonvolatile memory device comprises:
a memory cell array including the memory cells connected to a plurality of word lines and a plurality of bit lines;
a row decoder connected to the word lines; and
a page buffer connected to the bit lines.

15. An article of manufacture, comprising:
a log likelihood ratio (LLR) optimizer configured to optimize a log-likelihood ratio for a plurality of memory cells included in a nonvolatile memory device; and
an error correction code (ECC) decoder configured to perform error correction for the stored data based on the optimized LLR,
wherein the LLR optimizer is configured:
to monitor a variation of a threshold voltage distribution for the memory cells, wherein the monitoring of the variation of the threshold voltage distribution comprises:
detecting a present threshold voltage distribution for the memory cells, and
estimating a variation direction and a variation degree of the variation of the threshold voltage distribution, including comparing a previously-stored initial threshold voltage distribution for the memory cells with the present threshold voltage distribution, and
to update the LLR for the memory cells based on a result of the monitoring.

16. The article of manufacture of claim 15, comprising a memory controller including the log likelihood ratio optimizer and the ECC decoder.

17. The article of manufacture of claim 16, further comprising the nonvolatile memory device.

18. The article of manufacture of claim 15, wherein the log likelihood ratio optimizer is configured to monitor the variation of the threshold voltage distribution by:
estimating the variation direction and the variation degree of the threshold voltage distribution based on a difference between a number of first memory cells, among the plural memory cells of the nonvolatile memory device, having a threshold voltage between a first voltage and a second voltage in a present state of the nonvolatile memory device, and a number of second memory cells, among the memory cells of the nonvolatile memory device, having a threshold voltage between the first voltage and a third voltage in the present state.

* * * * *